United States Patent
Taniguchi

(10) Patent No.: US 12,199,590 B2
(45) Date of Patent: Jan. 14, 2025

(54) ACOUSTIC WAVE DEVICE, FILTER, AND MULTIPLEXER

(71) Applicant: TAIYO YUDEN CO., LTD., Tokyo (JP)

(72) Inventor: Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 185 days.

(21) Appl. No.: 17/687,501

(22) Filed: Mar. 4, 2022

(65) Prior Publication Data

US 2022/0294420 A1   Sep. 15, 2022

(30) Foreign Application Priority Data

Mar. 15, 2021   (JP) ................. 2021-041100

(51) Int. Cl.
  *H03H 9/205*   (2006.01)
  *H03H 9/13*    (2006.01)
  *H03H 9/56*    (2006.01)

(52) U.S. Cl.
  CPC .............. *H03H 9/205* (2013.01); *H03H 9/13* (2013.01); *H03H 9/568* (2013.01)

(58) Field of Classification Search
  CPC ........... H03H 9/205; H03H 9/13; H03H 9/568
  See application file for complete search history.

(56) References Cited

U.S. PATENT DOCUMENTS

| | | |
|---|---|---|
| 2008/0055021 A1 | 3/2008 | Ueda et al. |
| 2008/0252398 A1 | 10/2008 | Jamneala et al. |
| 2018/0006631 A1 | 1/2018 | Kida et al. |
| 2020/0274520 A1* | 8/2020 | Shin ................. H03H 9/131 |

FOREIGN PATENT DOCUMENTS

| | | |
|---|---|---|
| JP | 2008-85989 A | 4/2008 |
| JP | 2009-10932 A | 1/2009 |
| JP | 2018-6919 A | 1/2018 |

OTHER PUBLICATIONS

Japanese Office Action dated Sep. 17, 2024 in a counterpart Japanese patent application No. 2021-041100.
Japanese Office Action dated Nov. 26, 2024 in a counterpart Japanese patent application No. 2021-041100.

\* cited by examiner

*Primary Examiner* — Samuel S Outten
(74) *Attorney, Agent, or Firm* — CHEN YOSHIMURA LLP

(57) ABSTRACT

An acoustic wave device includes a substrate, one or more acoustic layers provided on the substrate, the one or more acoustic layers each being an air gap or an acoustic mirror, the acoustic mirror having a structure in which at least two layers having different acoustic characteristics are stacked, lower electrodes provided on the substrate, the lower electrodes sharing one acoustic layer of the one or more acoustic layers between the substrate and the lower electrodes, the lower electrodes being arranged to be separated from each other across a groove, an insulating film provided in the groove on the one acoustic layer, a piezoelectric film continuously provided on the lower electrodes and the groove, and an upper electrode continuously provided on the piezoelectric film to form resonators by sandwiching the piezoelectric film between the upper electrode and the lower electrodes.

15 Claims, 15 Drawing Sheets

ACOUSTIC WAVE DEVICE, FILTER, AND MULTIPLEXER

FIELD

A certain aspect of the present disclosure relates to an acoustic wave device, a filter, and a multiplexer.

BACKGROUND

Acoustic wave devices using piezoelectric thin film resonators have been used as filters and multiplexers for wireless devices such as mobile phones. The piezoelectric thin film resonator has a structure in which a lower electrode and an upper electrode are opposite to each other across a piezoelectric film. The region where the lower electrode and the upper electrode are opposite to each other across the piezoelectric film is a resonance region. An air gap or an acoustic mirror is provided under the resonance region so as not to limit the vibration. The air gap or the acoustic mirror are provided so as to include the resonance region in a plan view.

There has been known a structure in which divided piezoelectric thin film resonators share one air gap or one acoustic mirror as disclosed in, for example, Japanese Patent Application Publication No. 2018-6919 (Patent Document 1). In this structure, one of the lower and upper electrodes is divided on or above the air gap or the acoustic mirror.

It has been known to divide a resonator so that the direction of the polarization of the piezoelectric film reduces the secondary distortion as disclosed in Japanese Patent Application Publication Nos. 2008-85989 and 2009-10932 (Patent Documents 2 and 3).

SUMMARY

For example, when the resonator is divided so that the secondary distortion is reduced as in Patent Documents 2 and 3, it may be conceivable that the divided resonators share one air gap or one acoustic mirror as disclosed in Patent Document 1. When the lower electrode is divided on the one air gap or the one acoustic mirror and then a continuous piezoelectric film and a continuous upper electrode are formed on the divided lower electrodes, cracks or other damages or the region where the crystallinity is deteriorated are more likely to be formed in the piezoelectric film.

The objective of the present disclosure is to reduce the deterioration of the piezoelectric film or the like.

In a first aspect of the present disclosure, there is provided an acoustic wave device including: a substrate; one or more acoustic layers provided on the substrate, the one or more acoustic layers each being an air gap or an acoustic mirror, the acoustic mirror having a structure in which at least two layers having different acoustic characteristics are stacked; lower electrodes provided on the substrate, the lower electrodes sharing one acoustic layer of the one or more acoustic layers between the substrate and the lower electrodes, the lower electrodes being arranged to be separated from each other across a groove; an insulating film provided in the groove on the one acoustic layer; a piezoelectric film continuously provided on the lower electrodes and the groove; and an upper electrode continuously provided on the piezoelectric film to form resonators by sandwiching the piezoelectric film between the upper electrode and the lower electrodes.

In the above acoustic wave device, the upper electrode may be not extracted to the outside of the acoustic layer in a plan view.

In the above acoustic wave device, the insulating film may be in contact with each of the lower electrodes.

In the above acoustic wave device, a first surface, which is located closer to the piezoelectric film, of the insulating film and first surfaces, which are located closer to the piezoelectric film, of the lower electrodes may be substantially in the same plane.

In the above acoustic wave device, a first surface, which is located closer to the piezoelectric film, of the insulating film may be located closer to the substrate than first surfaces, which are located closer to the piezoelectric film, of the lower electrodes, and may be located closer to the piezoelectric film than second surfaces, which are located closer to the substrate, of the lower electrodes.

In the above acoustic wave device, side surfaces of the insulating film may be in contact with side surfaces of the lower electrodes.

In the above acoustic wave device, there may be substantially no level difference between a first surface, which is located closer to the substrate, of the insulating film and each of first surfaces, which are located closer to the substrate, of the lower electrodes.

In the above acoustic wave device, the insulating film may extend underneath the lower electrodes such that an extended part of the insulating film may be provided on at least a part of each of first surfaces, which are located closer to the substrate, of the lower electrodes.

In the above acoustic wave device, the insulating film including said extended part may overlap with an entirety of the one acoustic layer in a plan view.

In the above acoustic wave device, the acoustic layer may be an air gap.

In the above acoustic wave device, a first surface, which is located closer to the air gap, of the substrate may be a substantially flat surface.

The acoustic wave device may further include an insertion film interposed between the upper electrode and at least one of the lower electrodes, the insertion film having a material different from a material of the piezoelectric film.

In a second aspect of the present disclosure, there is provided a filter including the above acoustic wave device.

In a third aspect of the present disclosure, there is provided a multiplexer including the above filter.

DETAILED DESCRIPTION

Embodiments will be described with reference to the accompanying drawings.

First Embodiment

Figure 1A:
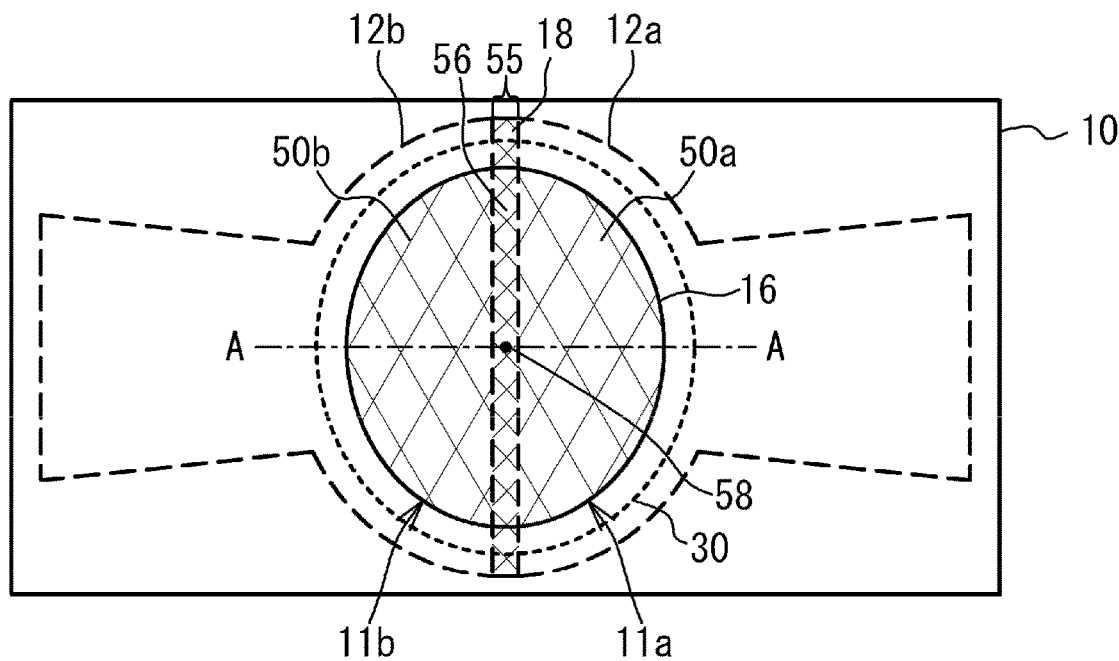
FIG. 1A is a plan view of an acoustic wave device in accordance with a first embodiment.
Figure 1B:
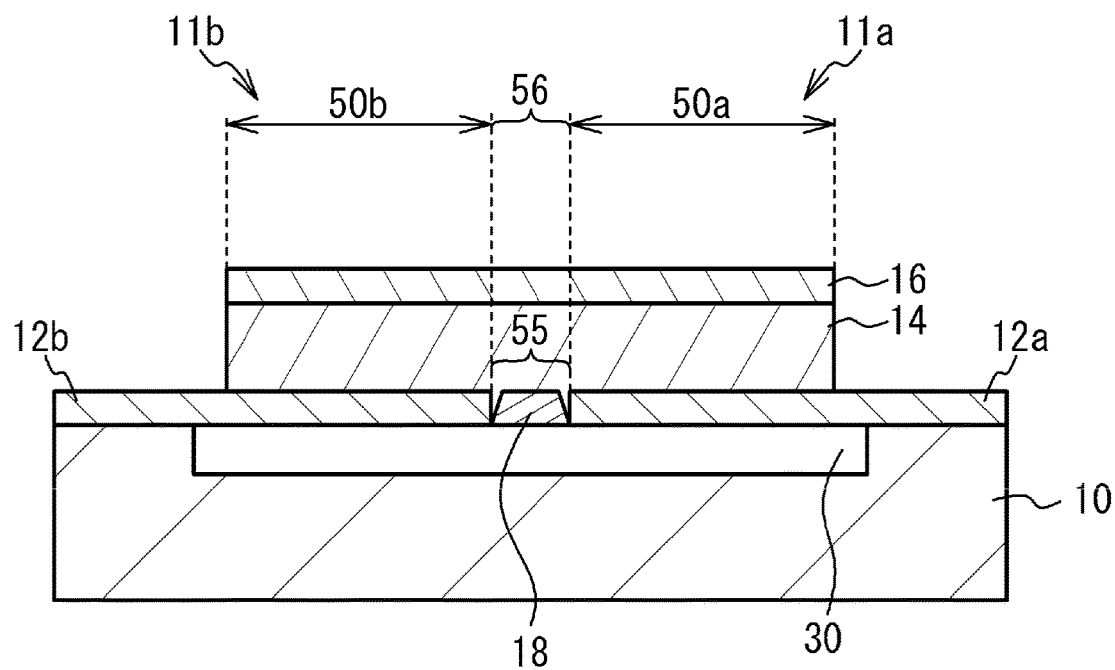
FIG. 1B is a cross-sectional view taken along line A-A in FIG. 1A.

FIG. 1A is a plan view of an acoustic wave device in accordance with a first embodiment, and FIG. 1B is a cross-sectional view taken along line A-A in FIG. 1A. In FIG. 1A, resonance regions 50a and 50b and an insulating film 18 are indicated by hatching.

As illustrated in FIG. 1A and FIG. 1B, a recessed portion is formed on the upper surface of a substrate 10, and an air gap 30 (an air layer) is provided in the recessed portion. Lower electrodes 12a and 12b are provided on the substrate 10 and the air gap 30. The lower electrodes 12a and 12b are separated from each other on the air gap 30, and a groove 55 is formed between the lower electrodes 12a and 12b. The insulating film 18 is provided in the groove 55. The insulating film 18 extends inside the groove 55 and reaches the top of the substrate 10 outside the air gap 30 (see FIG. 1A). A piezoelectric film 14 is continuously provided on the lower electrodes 12a and 12b and the insulating film 18. An upper electrode 16 is continuously provided on the piezoelectric film 14. A frequency adjusting film or a protective film may be provided on the upper electrode 16. In the parallel resonator of the ladder-type filter, a mass load film may be interposed between the upper electrode 16 and the frequency adjusting film or the protective film, or the upper electrode 16 may be formed of two layers, and a mass load film may be interposed between the two layers of the upper electrode 16.

The region where the lower electrode 12a and the upper electrode 16 overlap with each other across at least a part of the piezoelectric film 14 is a resonance region 50a, and the region where the lower electrode 12b and the upper electrode 16 overlap with each other across at least a part of the piezoelectric film 14 is a resonance region 50b. In a plan view, the resonance regions 50a and 50b are provided inside a single air gap 30. Each of the resonance regions 50a and 50b has a semi-elliptical shape, and is a region where the acoustic wave in the thickness extension mode or the thickness-shear mode resonates. The lower electrode 12a, the piezoelectric film 14, and the upper electrode 16 form a piezoelectric thin film resonator 11a, while the lower electrode 12b, the piezoelectric film 14, and the upper electrode 16 form a piezoelectric thin film resonator 11b. The resonators 11a and 11b are connected in series between the lower electrodes 12a and 12b.

The planar shape of the air gap 30 is an elliptical shape, and the center of the elliptical shape is a center 58. The region that overlaps with the upper electrode 16 and is located between the resonance regions 50a and 50b in a plan view is a dividing region 56. The dividing region 56 includes the center 58. The resonance regions 50a and 50b are located at both sides of the dividing region 56, the planar shape of the combined region of the resonance regions 50a and 50b and the dividing region 56 is similar to the shape of the air gap 30 (i.e., an elliptical shape), and is included in the air gap 30. In a plan view, the planar shape of the combined region of the resonance regions 50a and 50b and the dividing region 56 may be congruent to the shape of the air gap 30 and be in agreement with the air gap 30. The areas of the resonance regions 50a and 50b are, for example, substantially equal. The planar shape of the air gap 30 and the planar shape of the combined region of the resonance regions 50a and 50b and the dividing region 56 may be polygonal shapes such as, but not limited to, quadrangle shapes or pentagonal shapes instead of elliptical shapes. The upper electrode 16 is not extracted to the outside of the air gap 30, and is not coupled to any resonator other than the resonators 11a and 11b.

The substrate 10 is an insulating substrate such as, but not limited to, a silicon substrate, a sapphire substrate, a spinel substrate, an alumina substrate, a quartz substrate, a glass substrate, a crystal substrate, a ceramic substrate, or a GaAs substrate, or a semiconductor substrate. The lower electrodes 12a and 12b and the upper electrode 16 are formed of a single-layer film made of a metal such as, but not limited to, ruthenium (Ru), chrome (Cr), aluminum (Al), titanium (Ti), copper (Cu), molybdenum (Mo), tungsten (W), tantalum (Ta), platinum (Pt), rhodium (Rh) or iridium (Ir), or a multilayered film of any combination of them.

The piezoelectric film 14 is a film mainly composed of aluminum nitride (AlN), zinc oxide (ZnO), lead zirconate titanate (PZT), lead titanate (PbTiO$_3$), mono-crystalline lithium tantalate (LiTaO$_3$), or mono-crystalline lithium niobate (LiNbO$_3$). For example, the piezoelectric film 14 may be mainly composed of aluminum nitride and contain other elements for improving the resonance characteristics or the piezoelectricity. For example, use of scandium (Sc), use of a Group II element and a Group IV element, or use of a Group II element and a Group V element as additive elements improves the piezoelectricity of the piezoelectric film 14. Therefore, the effective electromechanical coupling coefficient of the piezoelectric thin film resonator can be improved. Examples of the Group II element include, but are not limited to, calcium (Ca), magnesium (Mg), strontium (Sr), and zinc (Zn). Examples of the Group IV element include, but are not limited to, titanium, zirconium (Zr), and hafnium (Hf). Examples of the Group V element include, but are not limited to, tantalum, niobium (Nb), and vanadium (V). The piezoelectric film 14 may be mainly composed of aluminum nitride and contain boron (B).

The insulating film is an inorganic insulating film, and is, for example, a metal oxide film such as a silicon oxide film or an aluminum oxide film, or a metal nitride film such as a silicon nitride film or an oxynitride silicon film. The frequency adjusting film and the protective film are insulating films such as, but not limited to, silicon oxide films, silicon nitride films, or aluminum oxide films. The mass load film is a metal film made of one of the materials exemplified as the material of the lower electrodes 12a and 12b and the upper electrode 16, or an insulating film such as, but not limited to, a silicon oxide film, a silicon nitride film, or an aluminum oxide film.

In the case that the piezoelectric thin film resonator has a resonant frequency of 2 GHz, the lower electrodes 12a and 12b are formed of a chrome film with a film thickness of 100 nm and a ruthenium film with a film thickness of 250 nm that are stacked in this order from the substrate 10 side. The piezoelectric film 14 is an aluminum nitride film with a film thickness of 1100 nm. The upper electrode 16 is formed of a ruthenium film with a film thickness of 250 nm and a chrome film with a film thickness of 50 nm that are stacked in this order from the piezoelectric film 14 side. The film thickness of each layer can be freely selected to obtain the desired resonance characteristics.

Manufacturing Method of the First Embodiment

Figure 2A:
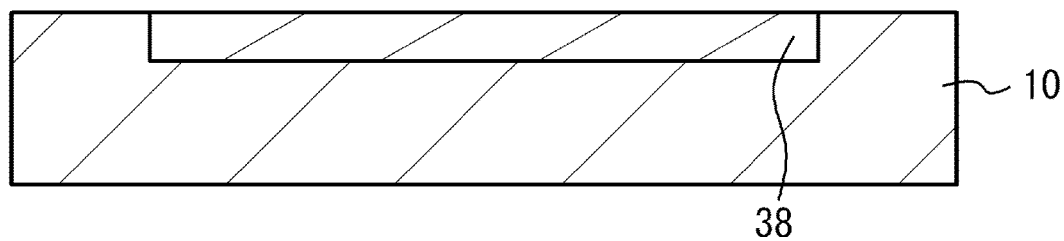
FIG. 2A to FIG. 2C are cross-sectional views (No. 1) illustrating a method of manufacturing the acoustic wave device in accordance with the first embodiment.

FIG. 2A to FIG. 3C are cross-sectional views illustrating a method of manufacturing the acoustic wave device in accordance with the first embodiment. As illustrated in FIG. 2A, a recessed portion is formed on the upper surface of the substrate 10. A sacrifice layer 38 is formed in the recessed portion by, for example, sputtering, vacuum evaporation, or chemical vapor deposition (CVD). The sacrifice layer 38 is made of, for example, magnesium oxide (MgO), zinc oxide (ZnO), germanium (Ge), or silicon oxide ($SiO_2$). The upper surfaces of the substrate 10 and the sacrifice layer 38 are planarized by chemical mechanical polishing (CMP).

Figure 2B:
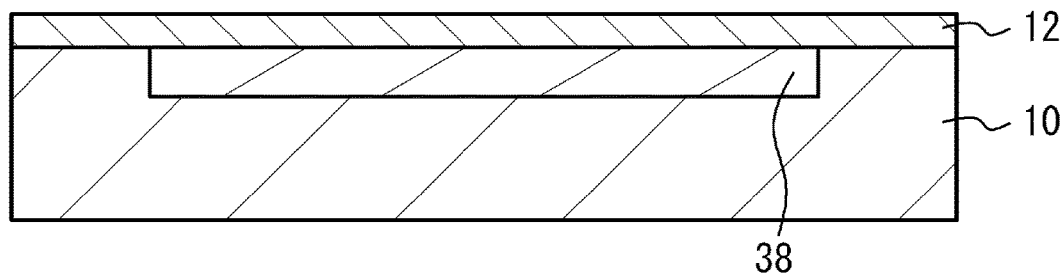
Figure 2C:
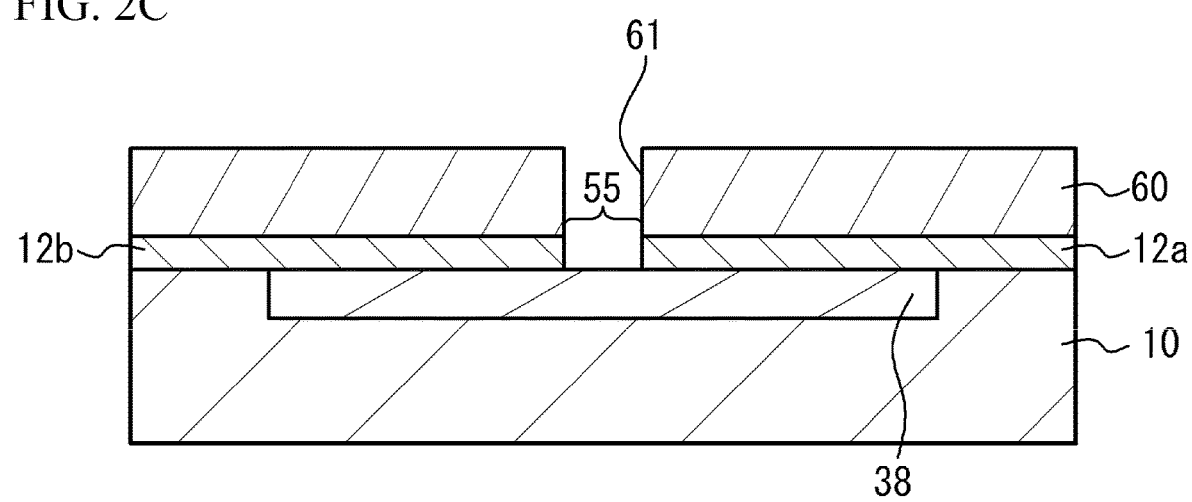

As illustrated in FIG. 2B, a lower electrode 12 is formed on the sacrifice layer 38 and the substrate 10 by, for example, sputtering, vacuum evaporation, or CVD. As illustrated in FIG. 2C, a mask layer 60 having an aperture 61 is formed on the lower electrode 12. The mask layer 60 is made of, for example, a photoresist, and is formed using photolithography. The lower electrode 12 is removed using the mask layer 60 as a mask to form the lower electrodes 12a and 12b and the groove 55. The lower electrode 12 is removed by, for example, dry etching.

Figure 3A:
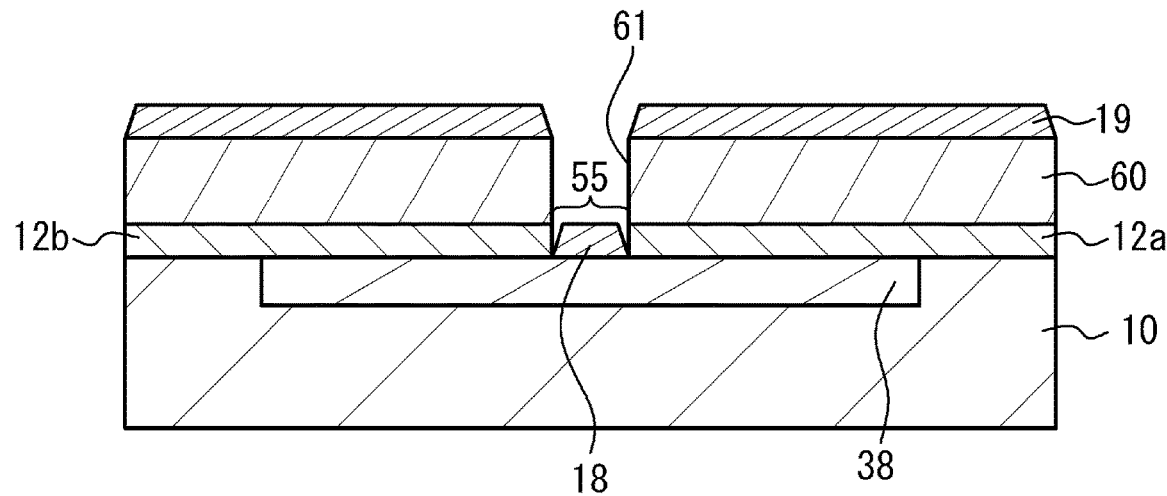
FIG. 3A to FIG. 3C are cross-sectional views (No. 2) illustrating the method of manufacturing the acoustic wave device in accordance with the first embodiment.
Figure 3B:
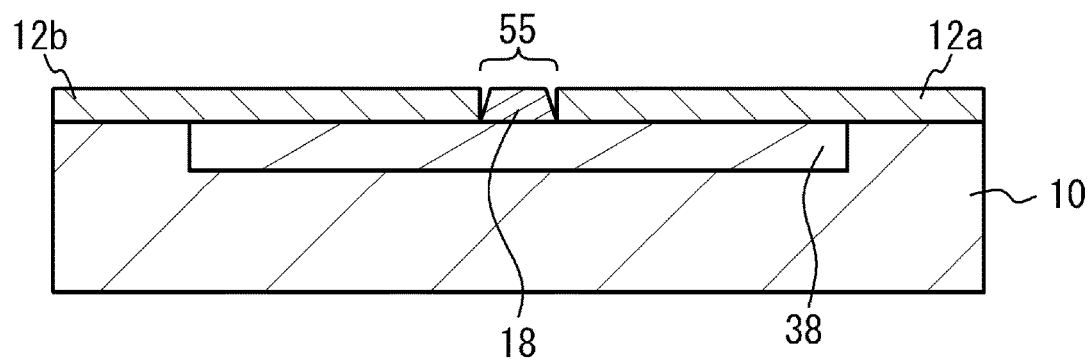

As illustrated in FIG. 3A, insulating films 18 and 19 are formed in the groove 55 and on the mask layer 60. The insulating films 18 and 19 are formed by, for example, CVD, sputtering, or vacuum evaporation. By removing the mask layer 60 as illustrated in FIG. 3B, the insulating film 18 is left in the groove 55.

Figure 3C:
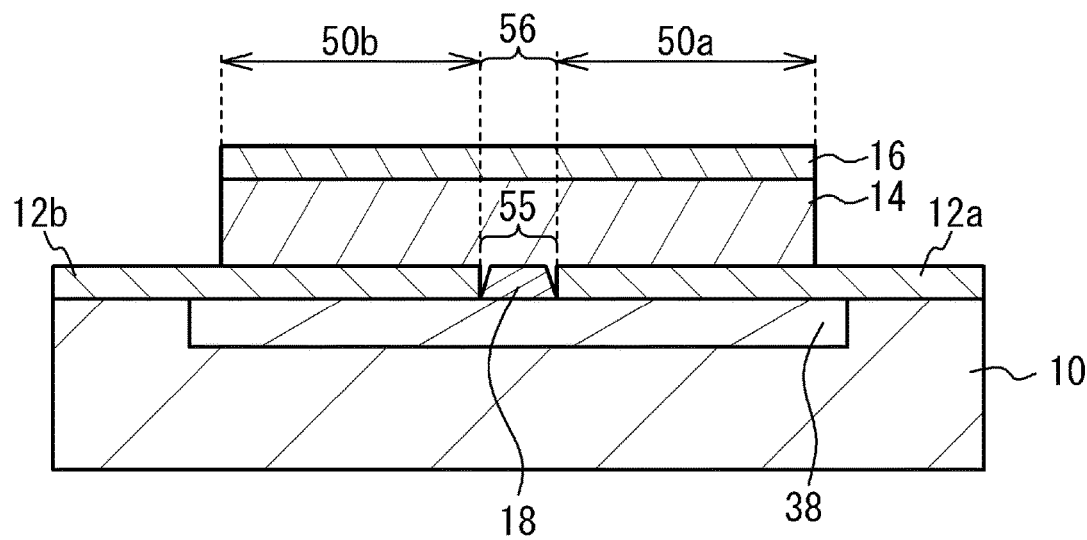

As illustrated in FIG. 3C, the piezoelectric film 14 is formed on the lower electrodes 12a and 12b and the insulating film 18 by, for example, sputtering or vacuum evaporation. The upper electrode 16 is formed on the piezoelectric film 14 by, for example, sputtering, vacuum evaporation, or CVD. The upper electrode 16 and the piezoelectric film 14 are patterned by, for example, photolithography and etching. The above processes form the resonance regions 50a and 50b and the dividing region 56. Thereafter, the sacrifice layer 38 is removed using an etching medium (an etching liquid). The etching medium is preferably a medium that does not etch the substrate 10, the lower electrodes 12a, 12b, the piezoelectric film 14, the upper electrode 16, or the insulating film 18 other than the sacrifice layer 38. Examples of the etching medium include, but are not limited to, a hydrofluoric acid or a nitric acid. The removal of the sacrifice layer 38 forms the air gap 30 between the lower electrode 12 and the substrate 10. Through the above steps, the acoustic wave device illustrated in FIG. 1A and FIG. 1B is manufactured.

Figure 4A:
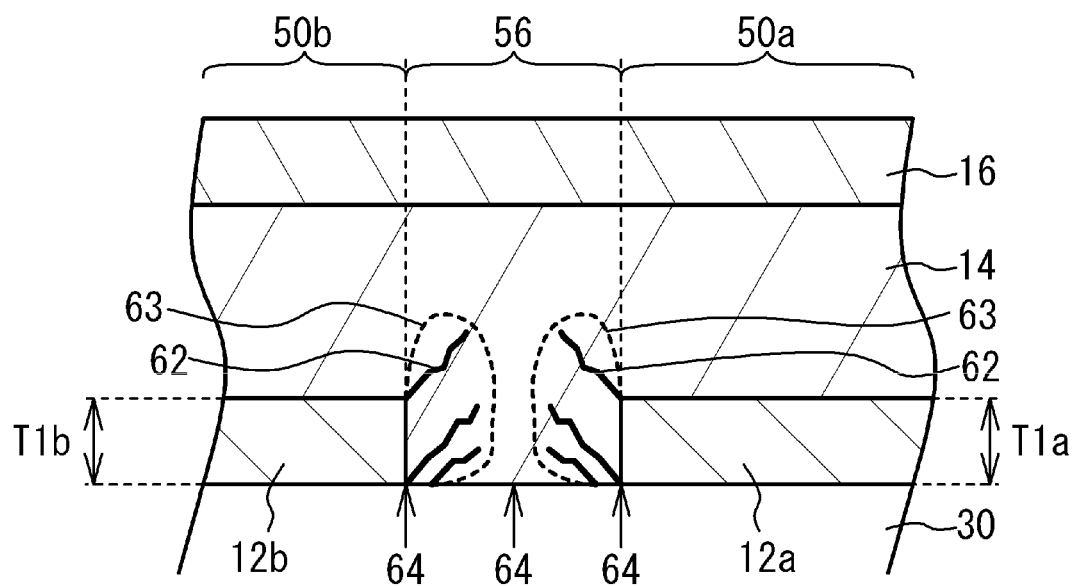
FIG. 4A and FIG. 4B are enlarged cross-sectional views of acoustic wave devices in accordance with a first comparative example and the first embodiment, respectively.
Figure 4B:
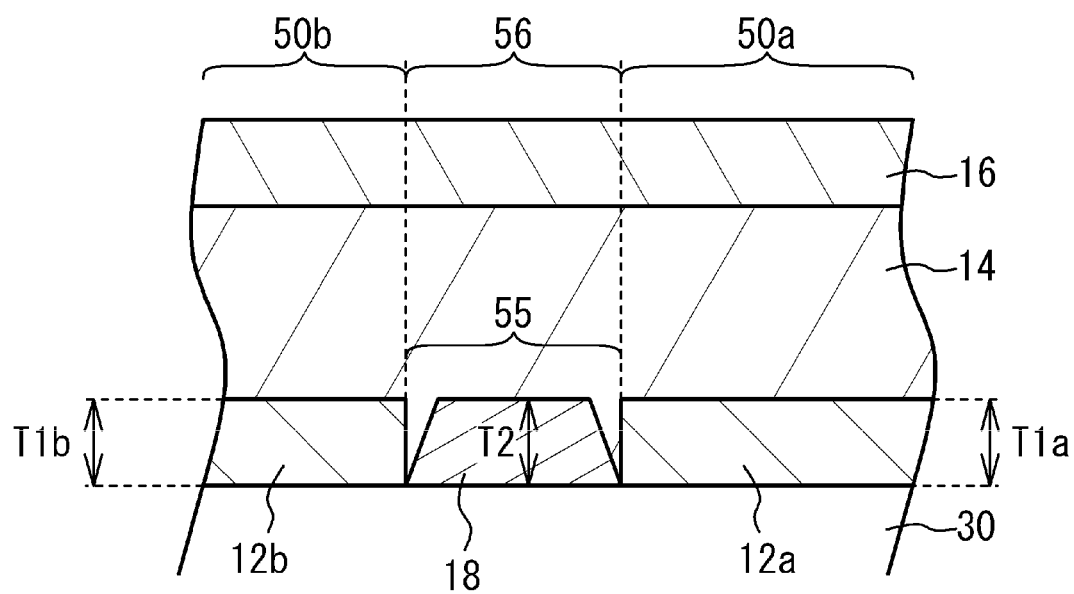

FIG. 4A and FIG. 4B are enlarged cross-sectional views of acoustic wave devices in accordance with a first comparative example and the first embodiment, respectively. As illustrated in FIG. 4A, in the first comparative example, no insulating film 18 is provided. The lower surface of the piezoelectric film 14 between the lower electrodes 12a and 12b and the lower surfaces of the lower electrodes 12a and 12b form a substantially flat surface. The piezoelectric film 14 is formed so that the lower surface of the piezoelectric film 14 has a level difference having a height equal to the thicknesses T1a and T1b of the lower electrodes 12a and 12a. Therefore, cracks 62 may be formed in the edges of the level difference. In addition, a region 63 where the piezoelectric film 14 have reduced crystallinity may be formed near the ends of the lower electrodes 12a and 12b. In FIG. 3C, when the sacrifice layer 38 is etched, the etching liquid may erode the piezoelectric film 14 as indicated by arrows 64. In particular, in the case that the crack 62 or the region 63 where the crystallinity is reduced is formed in the piezoelectric film 14, the piezoelectric film 14 is more likely to be eroded. Therefore, in the first comparative example, the piezoelectric film 14 may deteriorate.

As illustrated in FIG. 4B, in the first embodiment, the insulating film 18 is formed in the groove 55. The thickness T2 of the insulating film 18 is adjusted to be substantially equal to the thicknesses T1a and T1b of the lower electrodes 12a and 12b. The thicknesses T1a and T1b are substantially equal, and the upper surface of the insulating film 18 and the upper surfaces of the lower electrodes 12a and 12b are substantially in the same plane. This structure inhibits cracks and the region 63 where the crystallinity is reduced from being formed near the ends of the lower electrodes 12a and 12b. In addition, the insulating film 18 protects the lower surface of the piezoelectric film 14 in the dividing region 56. Therefore, the piezoelectric film 14 is inhibited from being eroded when the sacrifice layer 38 is etched. As described above, in the first embodiment, the deterioration of the piezoelectric film 14 is reduced.

Variation 1 of the First Embodiment

Figure 5A:
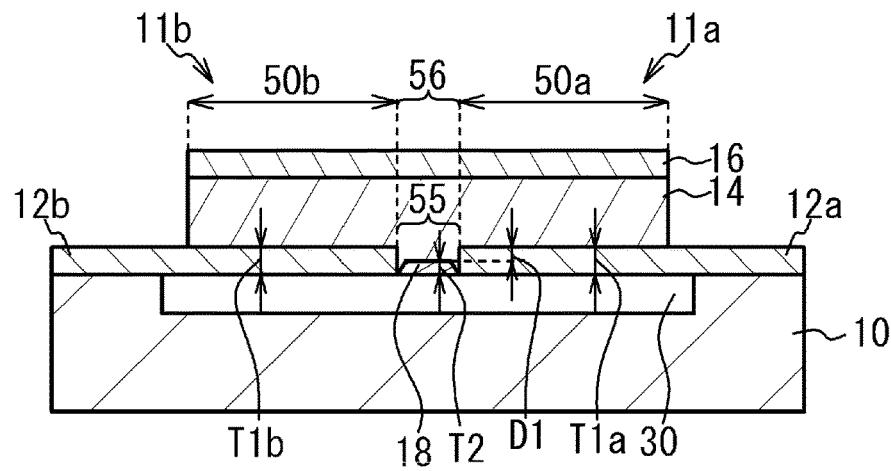
FIG. 5A to FIG. 5C are cross-sectional views illustrating acoustic wave devices in accordance with variations 1 to 3 of the first embodiment, respectively.

FIG. 5A to FIG. 9C are cross-sectional views illustrating acoustic wave devices in accordance with variations 1 to 18 of the first embodiment, respectively. As illustrated in FIG. 5A, in the variation 1 of the first embodiment, the thickness T2 of the insulating film 18 is less than the thicknesses T1a and T1b of the lower electrodes 12a and 12b. Even in the variation 1 of the first embodiment, the level difference D1 between the upper surfaces of the lower electrodes 12a and 12b and the upper surface of the insulating film 18 is smaller than the level difference of the lower surface of the piezoelectric film 14 corresponding to the heights T1a and T1b of the lower electrodes 12a and 12b in the first comparative example. Therefore, the formation of the crack 62 and the region 63 is inhibited. Because the insulating film 18 protects the lower surface of the piezoelectric film 14 in the dividing region 56, the erosion of the piezoelectric film 14 is inhibited. The level difference D1 is preferably equal to or less than ¾ of the thicknesses T1a and T1b, more preferably equal to or less than ½ of the thicknesses T1a and T1b. The insulating film 18 may be thicker than the lower electrodes 12a and 12b. Even in this case, the level difference D1 is preferably equal to or less than ¾ of the thicknesses T1a and T1b, more preferably equal to or less than ½ of the thicknesses T1a and T1b. Other structures are the same as those of the first embodiment, and the description thereof is thus omitted.

Variation 2 of the First Embodiment

Figure 5B:
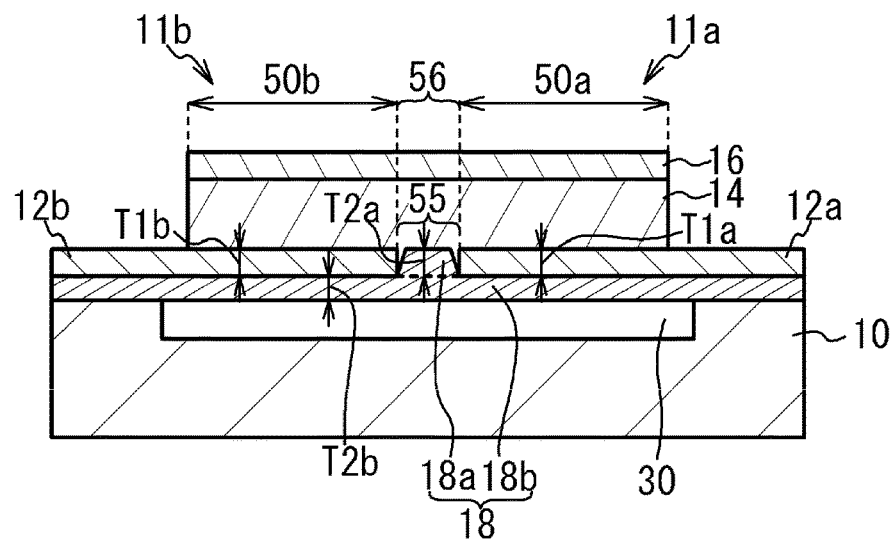

As illustrated in FIG. 5B, in the variation 2 of the first embodiment, the insulating film 18 includes a part 18a located in the groove 55 and a part 18b located under the lower electrodes 12a and 12b and the part 18a. The thickness T2a of the part 18a is substantially equal to the thicknesses T1a and T2b of the lower electrodes 12a and 12b. This structure inhibits the formation of the crack 62 and the region 63 as in the first embodiment. The part 18b is provided under the lower electrodes 12a and 12b over the entire air gap 30, thus reinforcing the resonance regions 50a and 50b. In the case that the part 18b is thick, the resonance characteristics of the resonators 11a and 11b decrease. Therefore, the thickness T2b of the part 18b is preferably less than the thicknesses T1a and T1b of the lower electrodes 12a and 12b, more preferably equal to or less than ½ of T1a and T1b, further preferably equal to or less than ¼ of T1a and T1b. Too thin T2b makes the reinforcement impossible. Therefore, the thickness T2b is preferably equal to or greater than ⅒ of T1a and T1b. Other structures are the same as those of the first embodiment, and the description thereof is thus omitted.

Variation 3 of the First Embodiment

Figure 5C:
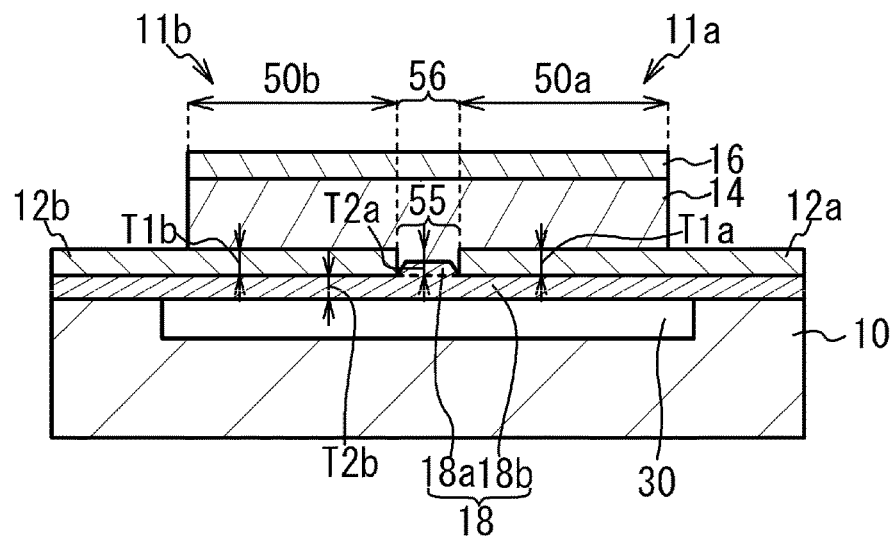

As illustrated in FIG. 5C, in the variation 3 of the first embodiment, the thickness T2a of the part 18a is thinner than the thicknesses T1a and T1b of the lower electrodes 12a and 12b. Even when the part 18a is thin as described above, the level difference D1 between the upper surface of the part 18a and the upper surfaces of the lower electrodes 12a and 12b is smaller than the thicknesses T1a and T1b. Therefore, as in the variation 2 of the first embodiment, the formation of the crack 62 and the region 63 is inhibited. The preferable range of the level difference D1 is the same as the preferable range of the level difference D1 of the variation 1 of the first embodiment. The part 18b is located under the lower electrodes 12a and 12b over the entire air gap 30. This structure reinforces the resonance regions 50a and 50b. Other structures are the same as those of the variation 2 of the first embodiment, and the description thereof is thus omitted.

Variation 4 of the First Embodiment

Figure 6A:
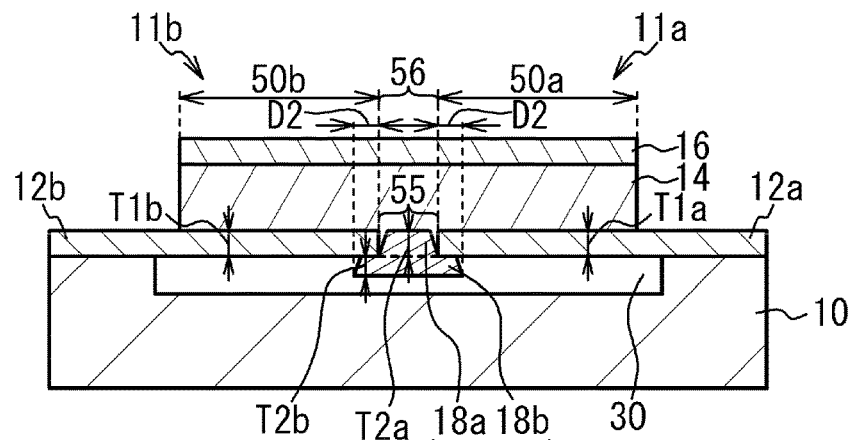
FIG. 6A to FIG. 6D are cross-sectional views illustrating acoustic wave devices in accordance with variations 4 to 7 of the first embodiment, respectively.

As illustrated in FIG. 6A, in the variation 4 of the first embodiment, the part 18b extends to a part outside the dividing region 56. The width of the part 18b in each of the resonance regions 50a and 50b is D2. The width D2 is preferably equal to or greater than the alignment margin between the part 18b and the lower electrodes 12a and 12b. Therefore, the width D2 is preferably equal to or greater than ⅒ of the thicknesses T1a and T1b, more preferably equal to or greater than ½ of the thicknesses T1a and T1b. The large width D2 deteriorates the resonance characteristics of the resonators 11a and 11b. Therefore, the width D2 is preferably equal to or less than two times the thicknesses T1a and T1b. Other structures are the same as those of the variation 2 of the first embodiment, and the description thereof is thus omitted.

Variation 5 of the First Embodiment

Figure 6B:
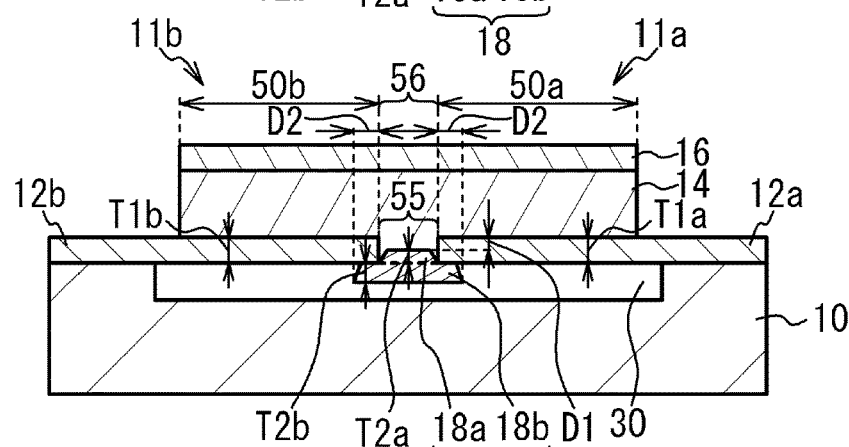

As illustrated in FIG. 6B, in the variation 5 of the first embodiment, the thickness T2a of the part 18a is less than the thicknesses T1a and T1b of the lower electrodes 12a and 12b. Other structures are the same as those of the variation 4 of the first embodiment, and the description thereof is thus omitted.

Variation 6 of the First Embodiment

Figure 6C:
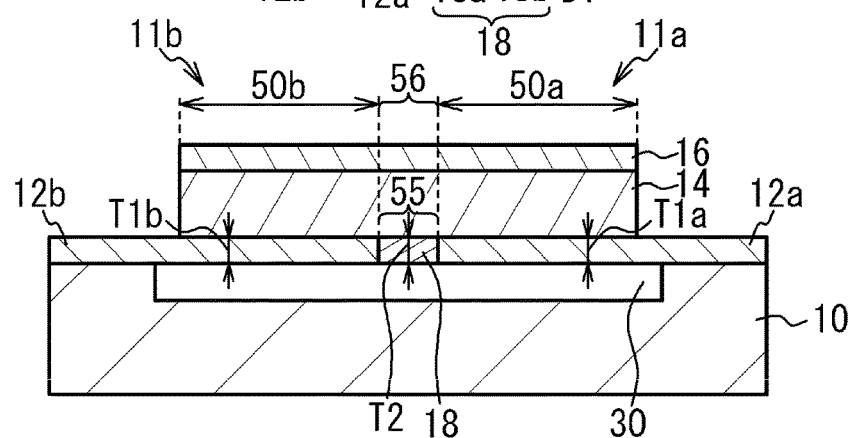

In the first embodiment, the side surfaces of the insulating film 18 are inclined with respect to the lower surface of the insulating film 18. Therefore, in the lower ends of the side surfaces of the insulating film 18, the insulating film 18 is in contact with the lower electrodes 12a and 12b, while near the upper surface of the insulating film 18, the insulating film 18 is separated from the lower electrodes 12a and 12b. Therefore, a recessed portion is formed between each of the upper surfaces of the lower electrodes 12a and 12b and the upper surface of the insulating film 18. As illustrated in FIG. 6C, in the variation 6 of the first embodiment, the side surfaces of the insulating film 18 are in contact with the side surfaces of the lower electrodes 12a and 12b. Therefore, unlike the first embodiment, the upper surfaces of the lower electrodes 12a and 12b and the insulating film 18 form a substantially flat surface. Thus, the formation of the crack 62 and the region 63 where the crystallinity is reduced in the piezoelectric film 14 is further inhibited. Other structures are the same as those of the first embodiment, and the description thereof is thus omitted.

Variation 7 of the First Embodiment

Figure 6D:
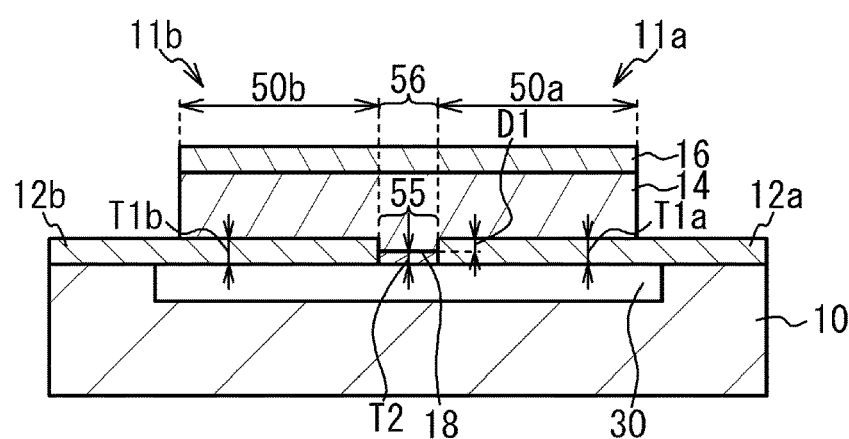

As illustrated in FIG. 6D, in the variation 7 of the first embodiment, the thickness T2 of the insulating film 18 is less than the thicknesses T1a and T1b of the lower electrodes 12a and 12b. The side surfaces of the insulating film 18 are in contact with the side surfaces of the lower electrodes 12a and 12b. This structure inhibits the formation of a recessed portion between each of the upper surfaces of the lower electrodes 12a and 12b and the upper surface of the insulating film 18 compared with the structure of the variation 1 of the first embodiment illustrated in FIG. 5A. Thus, the formation of the crack 62 and the region 63 where the crystallinity is reduced in the piezoelectric film 14 is further inhibited. Other structures are the same as those of the variation 1 of the first embodiment, and the description thereof is thus omitted.

Variation 8 of the First Embodiment

Figure 7A:
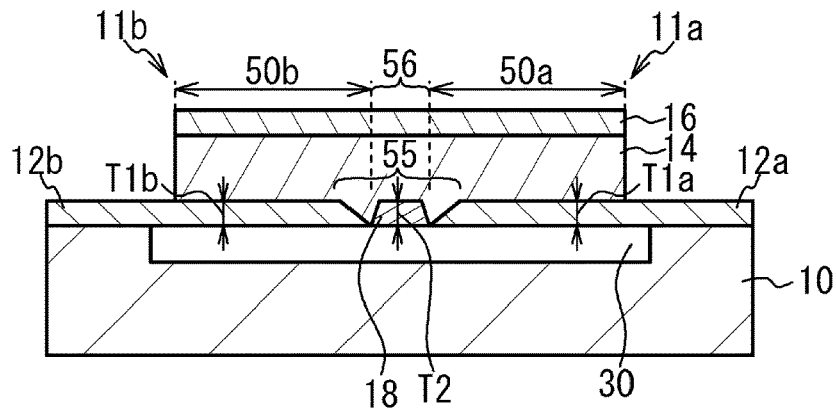
FIG. 7A to FIG. 7D are cross-sectional views illustrating acoustic wave devices in accordance with variations 8 to 11 of the first embodiment, respectively.

As illustrated in FIG. 7A, in the variation 8 of the first embodiment, the side surfaces of the lower electrodes 12a and 12b are inclined with respect to the lower surfaces of the lower electrodes 12a and 12b. The angle (the interior angle) between the lower surface and the side surface of each of the lower electrodes 12a and 12b is an acute angle, and is, for example, 20° to 60°. Other structures are the same as those of the variation 1 of the first embodiment, and the description thereof is thus omitted.

Variation 9 of the First Embodiment

Figure 7B:
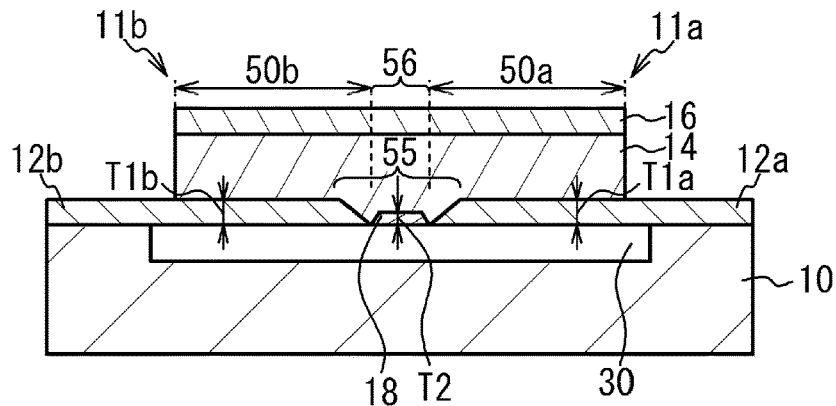

As illustrated in FIG. 7B, in the variation 9 of the first embodiment, the side surfaces of the lower electrodes 12a and 12b are inclined with respect to the lower surfaces of the lower electrodes 12a and 12b. Other structures are the same as those of the variation 1 of the first embodiment, and the description thereof is thus omitted.

Variation 10 of the First Embodiment

Figure 7C:
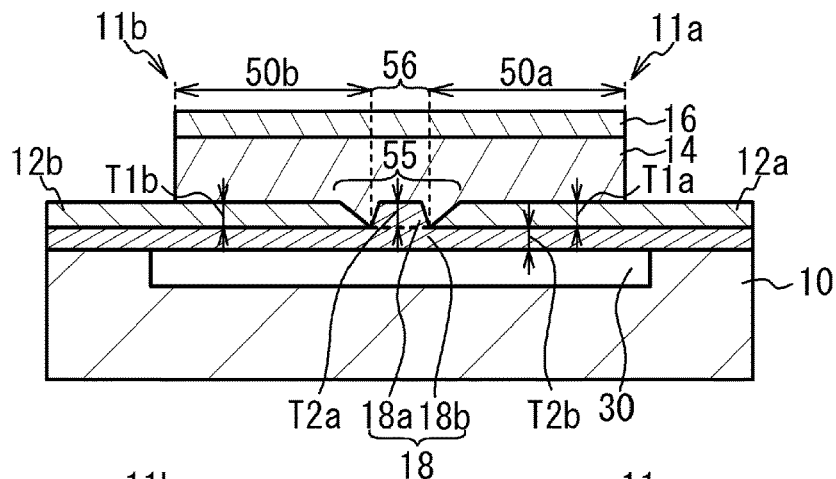

As illustrated in FIG. 7C, in the variation 10 of the first embodiment, the side surfaces of the lower electrodes 12a and 12b are inclined with respect to the lower surfaces of the lower electrodes 12a and 12b. Other structures are the same as those of the variation 2 of the first embodiment, and the description thereof is thus omitted.

Variation 11 of the First Embodiment

Figure 7D:
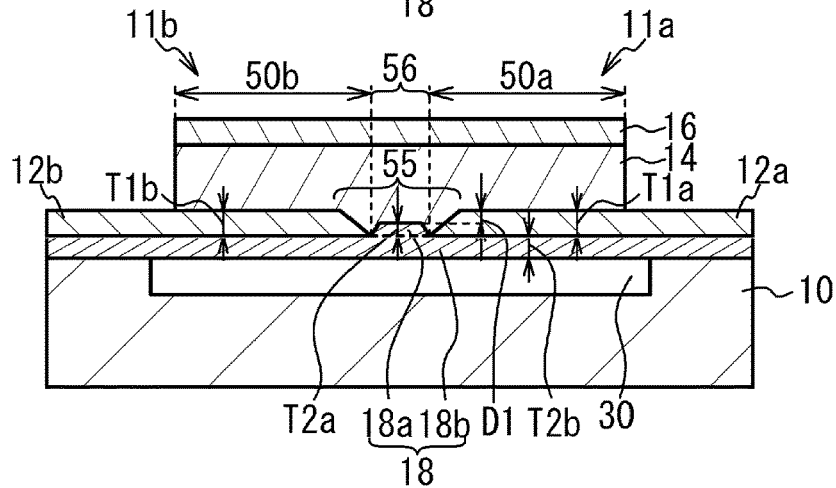

As illustrated in FIG. 7D, in the variation 11 of the first embodiment, the side surfaces of the lower electrodes 12a and 12b are inclined with respect to the lower surfaces of the lower electrodes 12a and 12b. Other structures are the same as those of the variation 3 of the first embodiment, and the description thereof is thus omitted.

Variation 12 of the First Embodiment

Figure 8A:
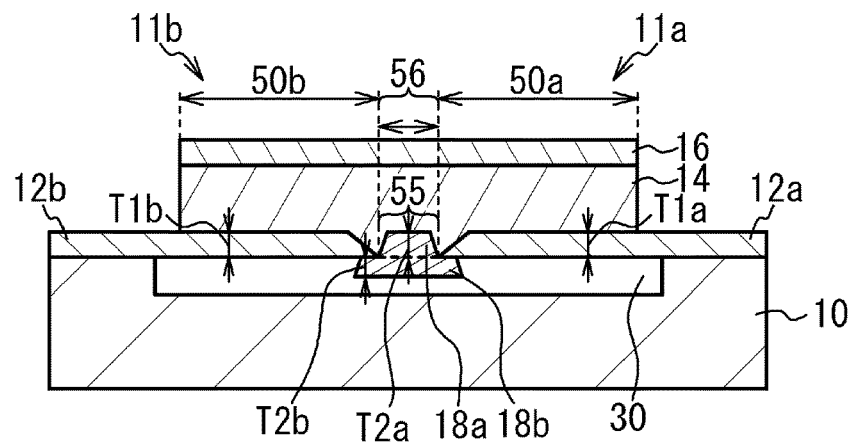
FIG. 8A to FIG. 8D are cross-sectional views illustrating acoustic wave devices in accordance with variations 12 to 15 of the first embodiment, respectively.

As illustrated in FIG. 8A, in the variation 12 of the first embodiment, the side surfaces of the lower electrodes 12a and 12b are inclined with respect to the lower surfaces of the lower electrodes 12a and 12b. Other structures are the same as those of the variation 4 of the first embodiment, and the description thereof is thus omitted.

Variation 13 of the First Embodiment

Figure 8B:
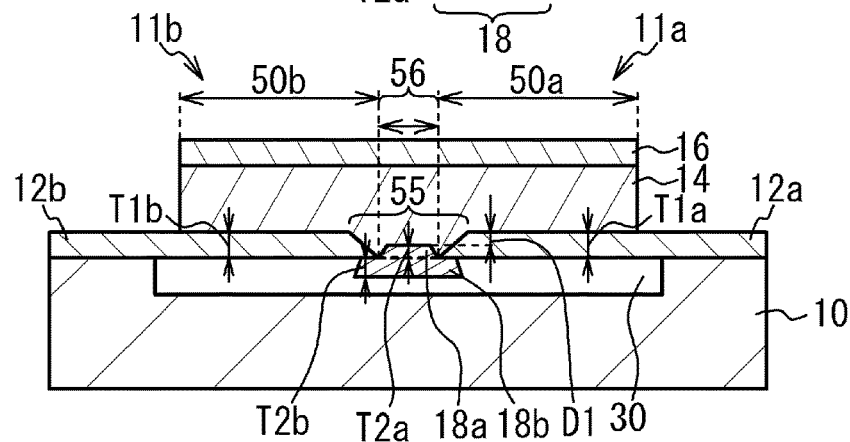

As illustrated in FIG. 8B, in the variation 13 of the first embodiment, the side surfaces of the lower electrodes 12a and 12b are inclined with respect to the lower surfaces of the lower electrodes 12a and 12b. Other structures are the same as those of the variation 5 of the first embodiment 5, and the description thereof is thus omitted. As in the variations 8 to 13 of the first embodiment, the side surfaces of the lower electrodes 12a and 12b may be inclined with respect to the lower surfaces. The angle between the lower surface and the side surface of each of the lower electrodes 12a and 12b is an acute angle. In the case that the angle between the lower surface and the side surface of the insulating film 18 is an acute angle, the angle between the side surface of each of the lower electrodes 12a and 12b and the side surface of the insulating film 18 is greater than those in the variation 1 to 5 of the first embodiment. Therefore, the formation of the crack 62 and the region 63 where the crystallinity is reduced in the piezoelectric film 14 is further inhibited.

Variation 14 of the First Embodiment

Figure 8C:
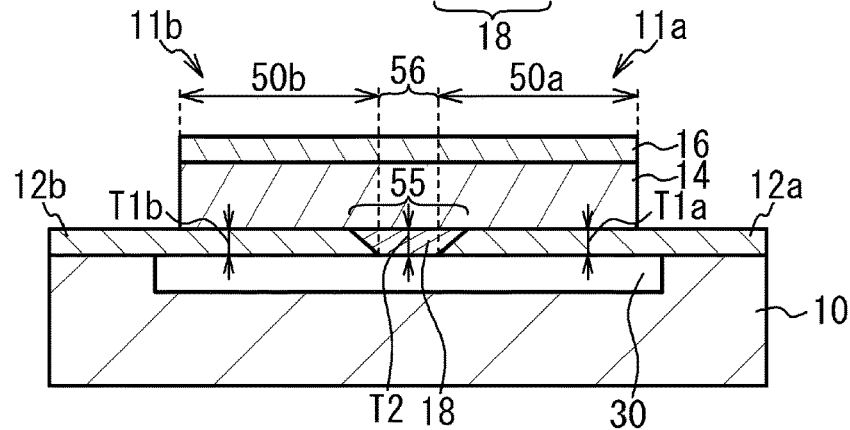

As illustrated in FIG. 8C, in the variation 14 of the first embodiment, the side surfaces of the insulating film 18 are in contact with the side surfaces of the lower electrodes 12a and 12b. Therefore, the upper surfaces of the lower electrodes 12a and 12b and the upper surface of the insulating film 18 form a substantially flat surface. Other structures are the same as those of the variation 8 of the first embodiment, and the description thereof is thus omitted.

Variation 15 of the First Embodiment

Figure 8D:
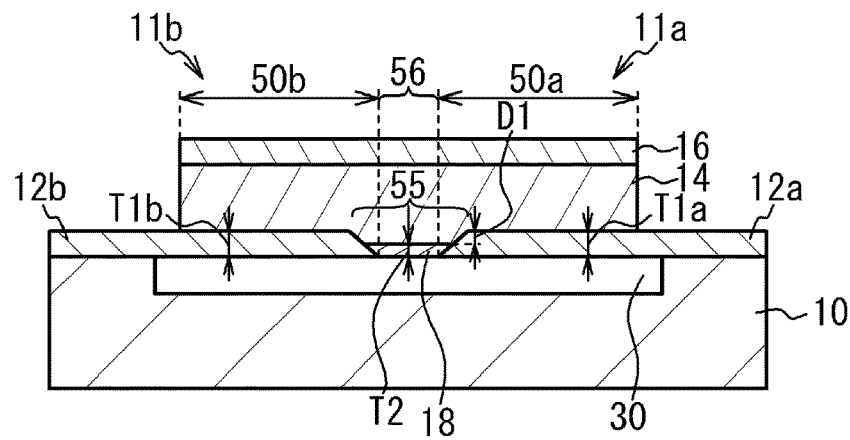

As illustrated in FIG. 8D, in the variation 15 of the first embodiment, the side surfaces of the insulating film 18 are in contact with the side surfaces of the lower electrodes 12a and 12b. Other structures are the same as those of the variation 9 of the first embodiment, and the description thereof is thus omitted.

Variation 16 of the First Embodiment

Figure 9A:
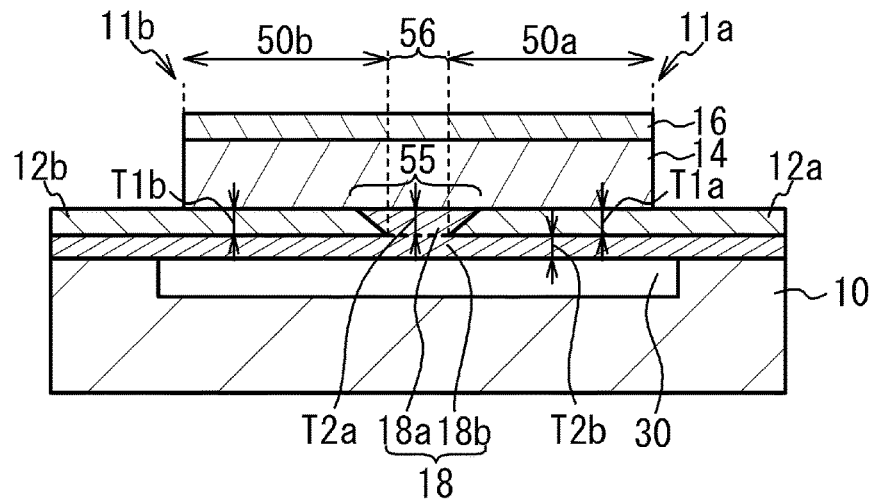
FIG. 9A to FIG. 9C are cross-sectional views illustrating acoustic wave devices in accordance with variations 16 to 18 of the first embodiment, respectively.

As illustrated in FIG. 9A, in the variation 16 of the first embodiment, the side surfaces of the insulating film 18 are in contact with the side surfaces of the lower electrodes 12a and 12b. Other structures are the same as those of the variation 10 of the first embodiment, and the description thereof is thus omitted.

Variation 17 of the First Embodiment

Figure 9B:
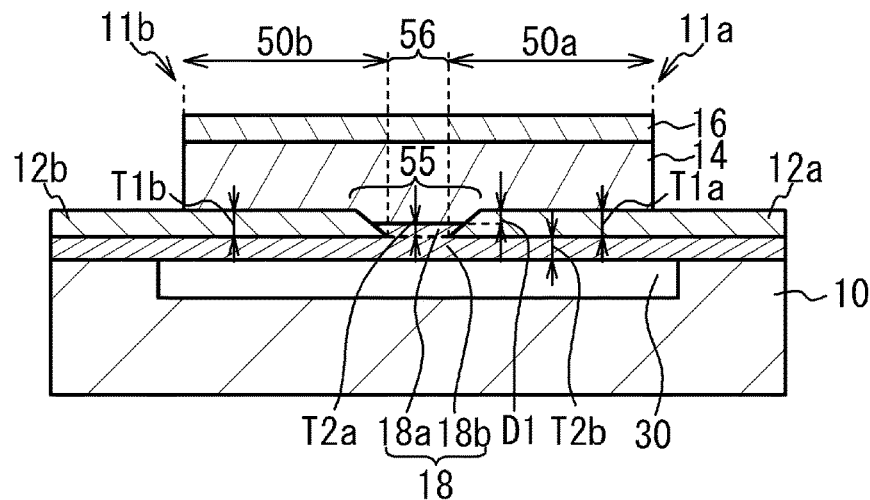

As illustrated in FIG. 9B, in the variation 17 of the first embodiment, the side surfaces of the insulating film 18 are in contact with the side surfaces of the lower electrodes 12a and 12b. Other structures are the same as those of the variation 10 of the first embodiment, and the description thereof is thus omitted. As in the variations 14 to 17 of the first embodiment, in the case that the angle between the lower surface and the side surface of each of the lower electrodes 12a and 12b is an acute angle, the side surface of the insulating film 18 may be in contact with the side surfaces of the lower electrodes 12a and 12b.

Variation 18 of the First Embodiment

Figure 9C:
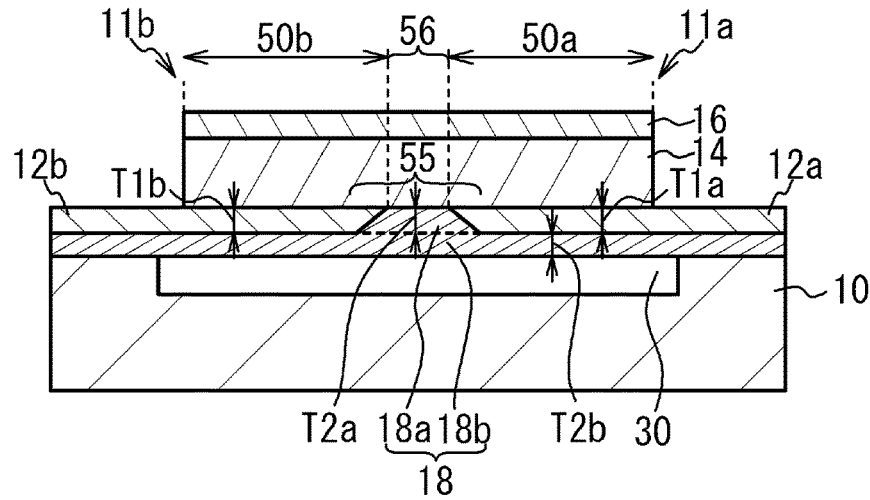

As illustrated in FIG. 9C, in the variation 18 of the first embodiment, the angle between the lower surface and the side surface of each of the lower electrodes 12a and 12b is an obtuse angle. The side surfaces of the insulating film 18 are in contact with the side surfaces of the lower electrodes 12a and 12b. Other structures are the same as those of the variation 16 of the first embodiment, and the description thereof is thus omitted. As in the variation 18 of the first embodiment, in the case that the angle between the lower surface and the side surface of each of the lower electrodes 12a and 12b is an obtuse angle, the side surfaces of the insulating film 18 may be in contact with the side surfaces of the lower electrodes 12a and 12b.

Variation 19 of the First Embodiment

Figure 10A:
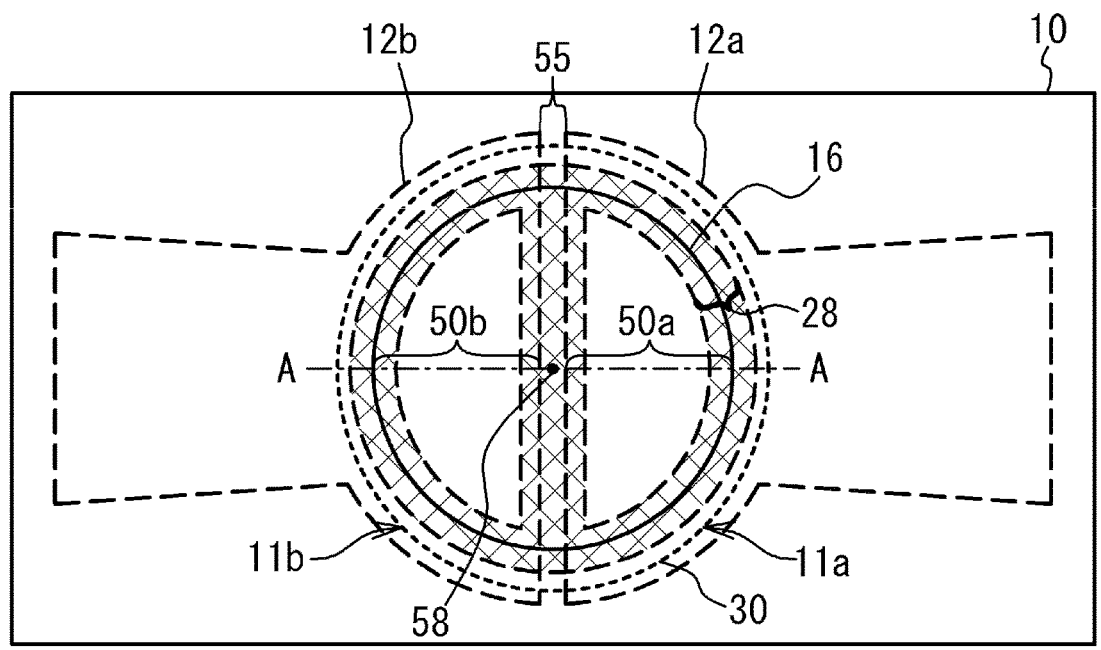
FIG. 10A is a plan view of an acoustic wave device in accordance with a variation 19 of the first embodiment.
Figure 10B:
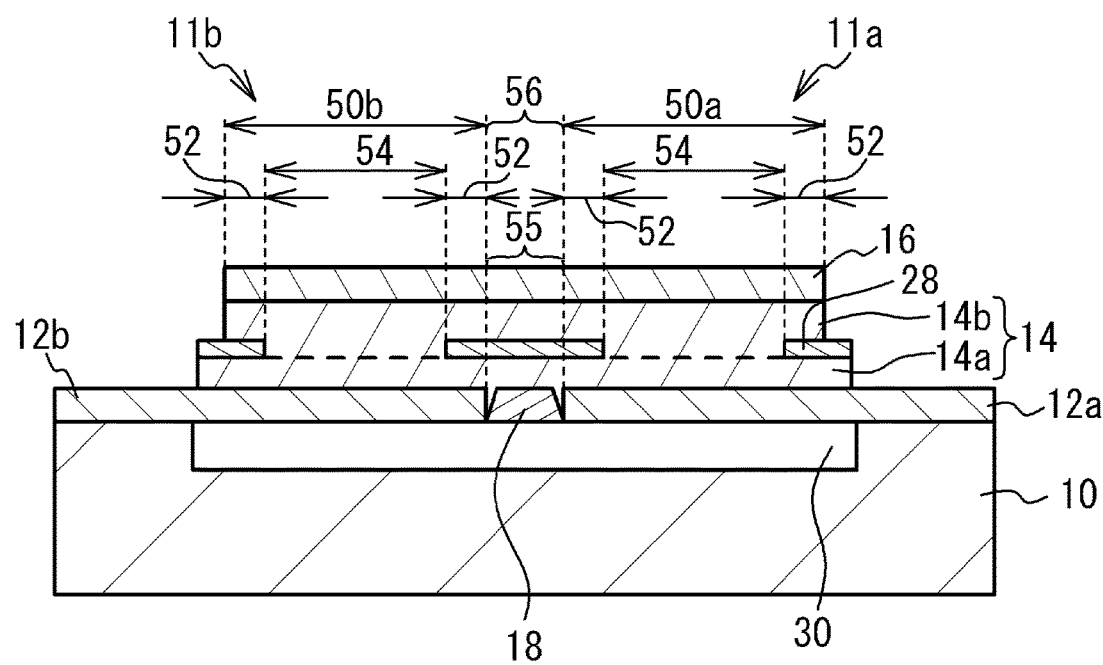
FIG. 10B is a cross-sectional view taken along line A-A in FIG. 10A.

FIG. 10A is a plan view of an acoustic wave device in accordance with a variation 19 of the first embodiment, and FIG. 10B is a cross-sectional view taken along line A-A in FIG. 10A. In FIG. 10A, an insertion film 28 is indicated by hatching. As illustrated in FIG. 10A and FIG. 10B, the piezoelectric film 14 includes a lower piezoelectric film 14a and an upper piezoelectric film 14b. The insertion film 28 is interposed between the lower piezoelectric film 14a and the upper piezoelectric film 14b. The insertion film 28 is provided in outer peripheral regions 52 of the resonance regions 50a and 50b and is not provided in center regions 54 of the resonance regions 50a and 50b. The outer peripheral regions 52 are the regions within the resonance regions 50a and 50b, and are the regions that include respective outer peripheries of the resonance regions 50a and 50b and are located along the respective outer peripheries. The outer peripheral region 52 has, for example, a strip shape. The center regions 54 are regions that are within the resonance regions 50a and 50b and include the respective centers of the resonance regions 50a and 50b. The center does not have to be the geometric center. The insertion film 28 is continuously provided from the outer peripheral regions 52 to the outsides of the resonance regions 50a and 50b, and is provided in the dividing region 56. The side surface of the lower piezoelectric film 14a is located further out than the side surface of the upper piezoelectric film 14b, and the insertion film 28 is provided on the lower piezoelectric film 14a located outside of the upper piezoelectric film 14b.

The acoustic impedance of the insertion film 28 is preferably less than the acoustic impedance of the piezoelectric film 14. In the case that the piezoelectric film 14 is mainly composed of aluminum nitride, the insertion film 28 is, for example, a silicon oxide film, an aluminum film, a gold film, a copper film, a titanium film, a platinum film, or a tantalum film. By providing the insertion film 28 in the region where the resonance regions 50a and 50b are adjacent to each other, the interference between the acoustic waves of the resonators 11a and 11b is reduced. In addition, the acoustic waves are inhibited from leaking from the resonators 11a and 11b to the substrate 10, and therefore, the Q factor can be improved. Other structures are the same as those of the first embodiment, and the description thereof is thus omitted.

Variation 20 of the First Embodiment

Figure 11A:
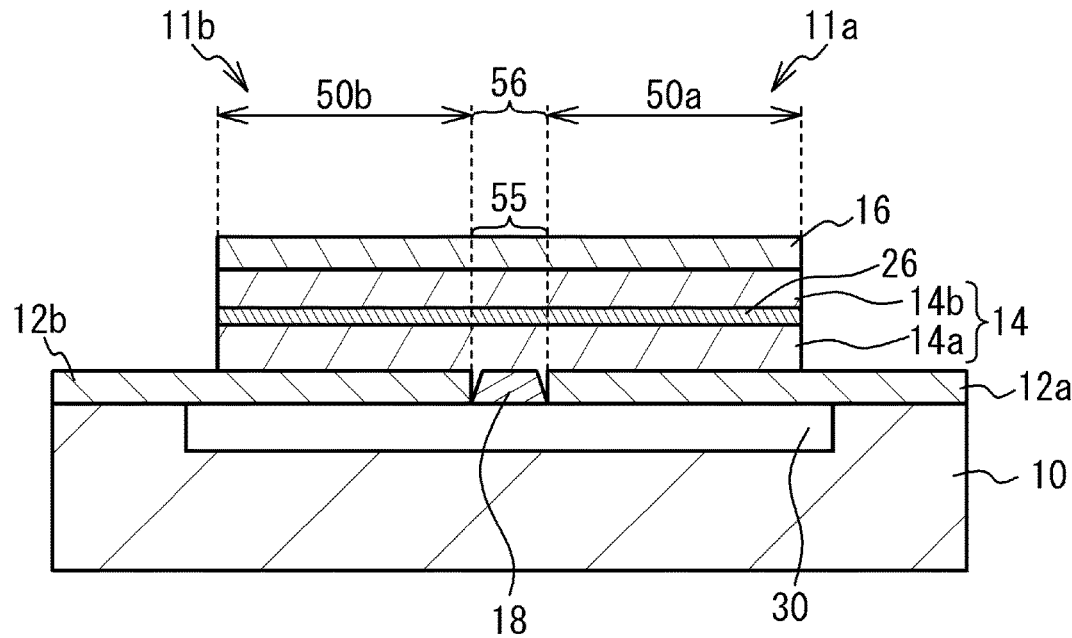
FIG. 11A and FIG. 11B are cross-sectional views illustrating acoustic wave devices in accordance with variations 20 and 21 of the first embodiment, respectively.

FIG. 11A is a cross-sectional view of an acoustic wave device in accordance with a variation 20 of the first embodiment. As illustrated in FIG. 11A, a temperature compensation film 26 is provided between the lower piezoelectric film 14a and the upper piezoelectric film 14b. The temperature compensation film 26 is provided across the entire resonance regions 50a and 50b and the entire dividing region 56. The temperature coefficient of the elastic constant of the temperature compensation film 26 is opposite in sign to the temperature coefficient of the elastic constant of the piezoelectric film 14. This makes the temperature coefficient of frequency of each of the resonators 11a and 11b small. The temperature compensation film 26 is, for example, a silicon oxide film to which no impurities are intentionally added, or a silicon oxide film to which impurities such as, but not limited to, fluorine are added. Other structures are the same as those of the first embodiment, and the description thereof is thus omitted.

Variation 21 of the First Embodiment

Figure 11B:
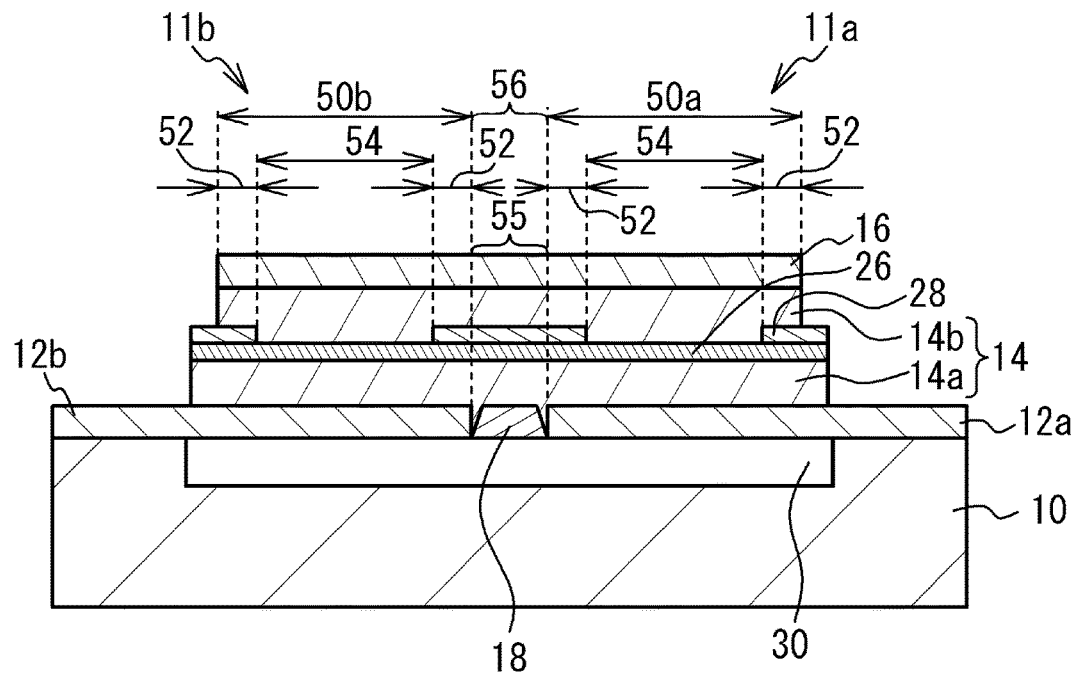

FIG. 11B is a cross-sectional view of an acoustic wave device in accordance with a variation 21 of the first embodiment. As illustrated in FIG. 11B, the temperature compensation film 26 and the insertion film 28 are provided between the lower piezoelectric film 14a and the upper piezoelectric film 14b. Other structures are the same as those of the variations 19 and 20 of the first embodiment, and the description thereof is thus omitted. As in the variations 19 to 21 of the first embodiment, the insertion film 28 and/or the temperature compensation film 26 may be provided in the first embodiment and the variations 1 to 18 of the first embodiment.

Variation 22 of the First Embodiment

Figure 12A:
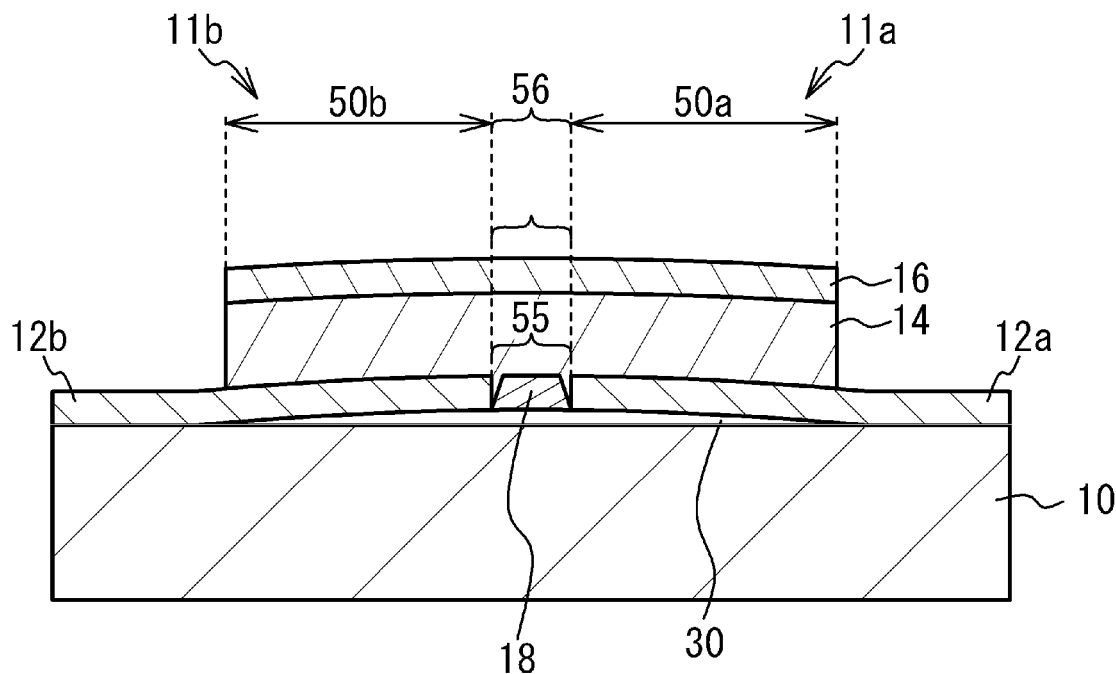
FIG. 12A and FIG. 12B are cross-sectional views illustrating acoustic wave devices in accordance with variations 22 and 23 of the first embodiment, respectively.
Figure 12B:
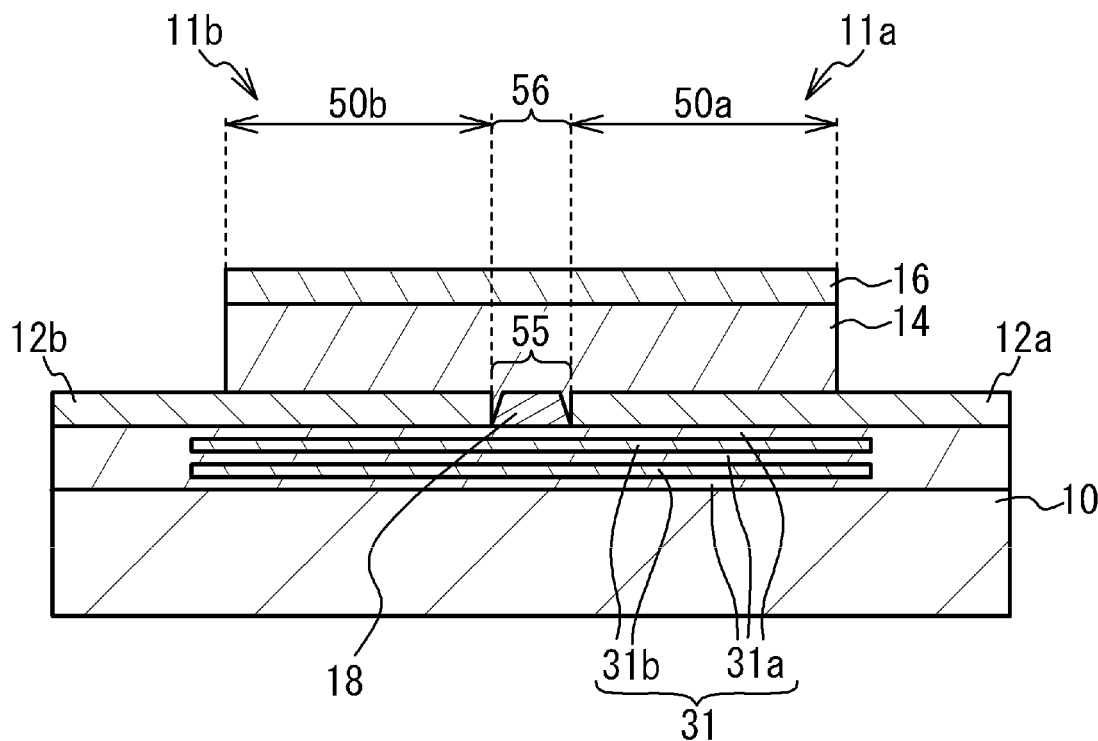

In variations 22 and 23 of the first embodiment, the structure of the air gap is changed. FIG. 12A and FIG. 12B are cross-sectional views of the vicinity of the resonance region in the variations 22 and 23 of the first embodiment, respectively. As illustrated in FIG. 12A, the upper surface of the substrate 10 is flat. A dome-shaped air gap 30 is formed between the upper surface of the substrate 10 and the lower surfaces of the lower electrodes 12a and 12b and the insulating film 18. The dome shape is a shape in which the height of the air gap 30 is small in the periphery of the air gap 30, and increases at closer distances to the center of the air gap 30. To form the dome-shaped air gap 30, the total internal stress of the lower electrodes 12a and 12b, the piezoelectric film 14, and the upper electrode 16 is preferably adjusted to be a compression stress. Other structures are the same as those of the first embodiment, and the description thereof is thus omitted.

Variation 23 of the First Embodiment

As illustrated in FIG. 12B, instead of the air gap 30 of the first embodiment, an acoustic mirror 31 is formed. The acoustic mirror 31 has a structure in which a film 31a having a low acoustic impedance and a film 31b having a high acoustic impedance are alternately provided. The film thickness of each of the films 31a and 31b is, for example, substantially $\lambda/4$ ($\lambda$ is the wavelength of the acoustic wave). The number of the films 31a and 31b that are stacked can be freely selected. For example, the acoustic mirror 31 may have a structure in which a film having an acoustic impedance different from that of the substrate 10 is provided in the substrate 10. Other structures are the same as those of the first embodiment, and the description thereof is thus omitted.

In the first embodiment and the variations 1 to 21 of the first embodiment, the dome-shaped air gap 30 may be formed as in the variation 22 of the first embodiment, or the acoustic mirror 31 may be formed instead of the air gap 30 as in the variation 23 of the first embodiment.

As in the first embodiment and the variations 1 to 22 of the first embodiment, the resonators 11a and 11b may be a film bulk acoustic resonator (FBAR). As in the variation 23 of the first embodiment, the resonators 11a and 11b may be a solidly mounted resonator (SMR). As described above, the acoustic layer provided in or on the substrate 10 is the air gap 30 or the acoustic mirror 31 in which at least two layers with different acoustic characteristics are stacked.

In the first embodiment and the variations thereof, the acoustic layer is the air gap 30 or the acoustic mirror 31 in which at least two layers with different acoustic characteristics are stacked is provided on the substrate 10. The lower electrodes 12a and 12b are arranged so that the lower electrodes 12a and 12b share a single acoustic layer between the lower electrodes 12a and 12b and the substrate 10 and are separated from each other across the groove 55. The insulating film 18 is provided in the groove 55 on the acoustic layer. The piezoelectric film 14 is continuously provided on the lower electrodes 12a and 12b and the groove 55. The upper electrode 16 is continuously provided on the piezoelectric film 14, and forms the resonators 11a and 11b by sandwiching the piezoelectric film 14 between the upper electrode 16 and the lower electrodes 12a and 12b.

Accordingly, as described with use of FIG. 4B, the crack 62 and the region 63 where the crystallinity is reduced, which are formed in the first comparative example illustrated in FIG. 4A, are inhibited from being formed in the piezoelectric film 14. When the sacrifice layer 38 is removed in FIG. 3C, since the insulating film 18 protects the piezoelectric film 14, the erosion of the piezoelectric film 14 is inhibited. Thus, the deterioration of the piezoelectric film 14 can be inhibited.

The upper electrode 16 is not extracted to the outside of the acoustic layer in a plan view. That is, no resonator is connected to the upper electrode 16. In this structure, the resonators 11a and 11b are connected in series, and the polarization direction of the piezoelectric film 14 of the resonator 11a is opposite to that of the piezoelectric film 14 of the resonator 11b. Therefore, as described in Patent Document 1, the secondary distortion is reduced. In addition, since there is air above the upper electrode 16, the parasitic capacitance added to the upper electrode 16 in the dividing region 56 can be reduced. Therefore, the secondary distortion can be further reduced as described in FIG. 4 of Patent Document 1. To reduce the secondary distortion, the areas of the resonance regions 50a and 50b are preferably substantially equal to each other within a range of about the manufacturing error. In addition, the planar shapes of the resonance regions 50a and 50b are preferably symmetric (for example, point-symmetric, line-symmetric, or mirror-symmetric). The planar shapes of the resonance regions 50a and 50b may be asymmetric. This can inhibit the unnecessary waves of the resonators 11a and 11b from interfering with each other.

In addition, in the case that the upper electrode 16 is not extracted to the outside of the acoustic layer, the upper electrode 16 and the piezoelectric film 14 are included in the air gap 30 in a plan view. Therefore, the resonators 11a and 11b are supported by the substrate 10 through mainly the lower electrodes 12a and 12b, and the support strength is weak. By providing the insulating film 18, the resonators 11a and 11b can be reinforced.

The insulating film 18 is in contact with each of the lower electrodes 12a and 12b. For example, the insulating film 18 is in contact with at least the lower ends of the lower electrodes 12a and 12b. The insulating film 18 can reinforce the lower electrodes 12a and 12b. Additionally, the piezoelectric film 14 is inhibited from being exposed to the etching liquid for the sacrifice layer 38 as indicated by the arrows 64 in FIG. 4A of the first comparative example. Even when the insulating film 18 is in no contact with each of the lower electrodes 12a and 12b, the effect to inhibit the formation of the crack 62 and the region 63 can be obtained.

In the first embodiment and the variations 2, 4, 6, 8, 10, 12, 14, 16, and 18 thereof, a first surface, which is located closer to the piezoelectric film 14, of the insulating film 18 and first surfaces, which are located closer to the piezoelectric film 14, of the lower electrodes 12a and 12b are substantially in the same plane. This structure inhibits the formation of the crack 62 and the region 63 in the piezoelectric film 14. When two surfaces are substantially in the same plane, this means that the levels of the two surfaces may differ within a range of about the manufacturing error. In addition, the substantially flat surface means that there is substantially no difference on the surface, and the surface may curve or slope within a range of about the manufacturing error. For example, in the case that the air gap 30 is dome-shaped as illustrated in FIG. 12A of the variation 22 of the first embodiment, the height of the air gap 30 is approximately $1/100$ of the width of the air gap 30, and the upper surface of the air gap 30 can be considered to be the substantially flat surface. A recessed portion may be provided between the first surface, which is located closer to the piezoelectric film 14, of the insulating film 18 and the first surfaces, which are located closer to the piezoelectric film 14, of the lower electrodes 12a and 12b.

In the variations 1, 3, 5, 7, 9, 11, 13, 15, and 17 of the first embodiment, the first surface, which is located closer to the piezoelectric film 14, of the insulating film 18 is located closer to the substrate 10 than the first surfaces, which are located closer to the piezoelectric film 14, of the lower electrodes 12a and 12b, and is located closer to the piezoelectric film 14 than second surfaces, which are located closer to the substrate 10, of the lower electrodes 12a and 12b. In this structure, the level difference D1 is less than the thicknesses T1a and T1b. Thus, the formation of the crack 62 and the region 63 in the piezoelectric film 14 is inhibited.

As in the variations 6, 7, and 14 to 18 of the first embodiment, the side surfaces of the insulating film 18 are in contact with the side surfaces of the lower electrodes 12a and 12b. In this structure, no recessed portion is formed between the upper surface of the insulating film 18 and the upper surfaces of the lower electrodes 12a and 12b. Therefore, the formation of the crack 62 and the region 63 in the piezoelectric film 14 is further inhibited.

In the variations 6, 7, 14, 16, and 18 of the first embodiment, the first surface, which is located closer to the piezoelectric film 14, of the insulating film 18 and the first surfaces, which are located closer to the piezoelectric film 14, of the lower electrodes 12a and 12b form a substantially flat surface within a range of about the manufacturing error. That is, no recessed portion is provided between the first surface, which is located closer to the piezoelectric film 14, of the insulating film 18 and the first surfaces, which are located closer to the piezoelectric film 14, of the lower electrodes 12a and 12b. This structure further inhibits the formation of the crack 62 and the region 63 in the piezoelectric film 14.

In the first embodiment and the variations 1, 6 to 9, 14, and 15 of the first embodiment, a second surface, which is located closer to the substrate 10, of the insulating film 18 and the second surfaces, which are located closer to the substrate 10, of the lower electrodes 12a and 12b form a substantially flat surface within a range of about the manufacturing error. That is, there is substantially no level difference between the second surface of the insulating film 18 and each of the second surfaces of the lower electrodes 12a and 12b. In this structure, the insulating film 18 can be easily formed because it is sufficient if the lower electrodes 12a and 12b and the insulating film 18 are formed on the upper surface of the sacrifice layer 38 as illustrated in FIG. 3B.

In the variations 2 to 5, 10 to 13, and 16 to 18 of the first embodiment, a part of the insulating film 18 is provided on the second surfaces, which are located closer to the substrate 10, of the lower electrodes 12a and 12b. This structure allows the insulating film 18 to reinforce the lower electrodes 12a and 12b.

In the variations 2, 3, 10, 11, and 16 to 18 of the first embodiment, the insulating film 18 overlaps the entire acoustic layer in a plan view. This structure allows the insulating film 18 to reinforce the lower electrodes 12a and 12b.

In the case that the acoustic layer is the air gap 30 as in the variations 1 to 22 of the first embodiment, the strength of the dividing region 56 is low without the insulating film 18. Therefore, by providing the insulating film 18 in the dividing region 56, the lower electrodes 12a and 12b can be reinforced.

In the case that the surface located closer to the air gap 30 of the substrate 10 is a substantially flat surface within a range of about the manufacturing error as in the variation 22 of the first embodiment, the lower electrodes 12a and 12b curve upward. The strength of the dividing region 56 is low without the insulating film 18. Therefore, by providing the insulating film 18 in the dividing region 56, the lower electrodes 12a and 12b can be reinforced.

As in the variations 19 to 21 of the first embodiment, the insertion film 28 having a material different from the material of the piezoelectric film 14 and/or the temperature compensation film 26 having a material different from the material of the piezoelectric film 14 may be interposed between the upper electrode 16 and at least one of the lower electrodes 12a and 12b.

Second Embodiment

Figure 13:
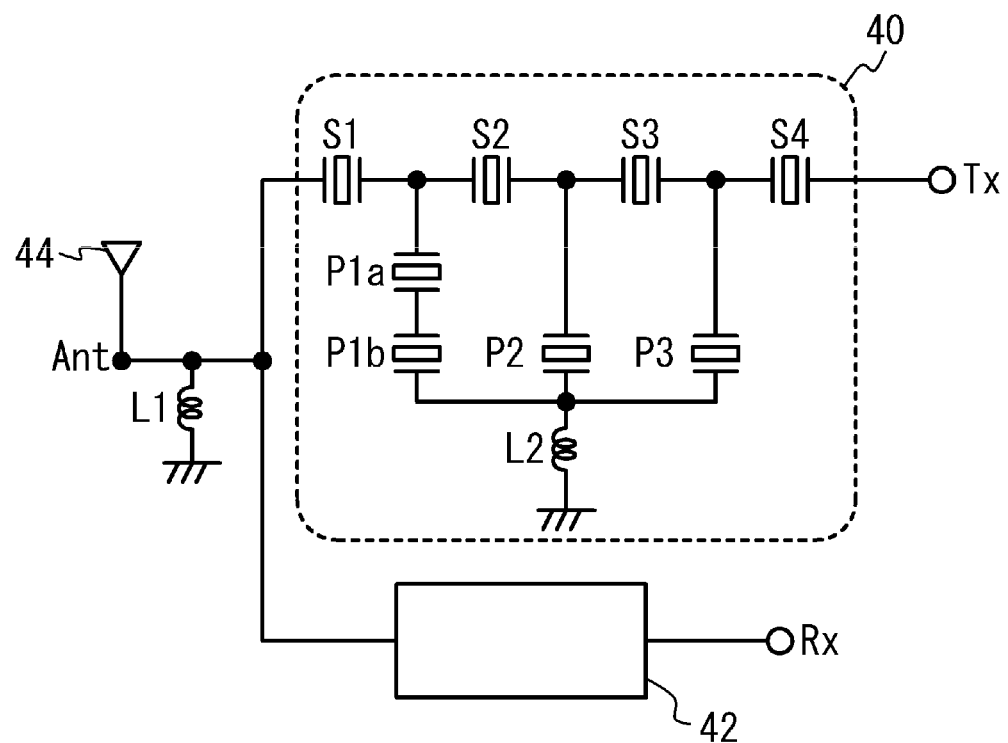
FIG. 13 is a circuit diagram of a duplexer in accordance with a second embodiment.

A second embodiment is an exemplary duplexer. FIG. 13 is a circuit diagram of a duplexer in accordance with the second embodiment. As illustrated in FIG. 13, a common terminal Ant is coupled to an antenna 44. A transmit filter 40 is connected between the common terminal Ant and a transmit terminal Tx. A receive filter 42 is connected between the common terminal Ant and a receive terminal Rx. An inductor L1, as a matching circuit, is connected between the common terminal Ant and a ground. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The inductor L1 matches the impedance so that the transmission signal transmitted through the transmit filter 40 is output from the common terminal Ant without leaking to the receive filter 42.

The transmit filter 40 is a ladder-type filter. Series resonators S1 to S4 are connected in series between the common terminal Ant and the transmit terminal Tx. Parallel resonators P1 to P3 are connected in parallel between the common terminal Ant and the transmit terminal Tx. First ends of the parallel resonators P1 to P3 are jointly grounded through an inductor L2. The parallel resonator P1 is divided in series into resonators P1a and P1b.

Figure 14A:
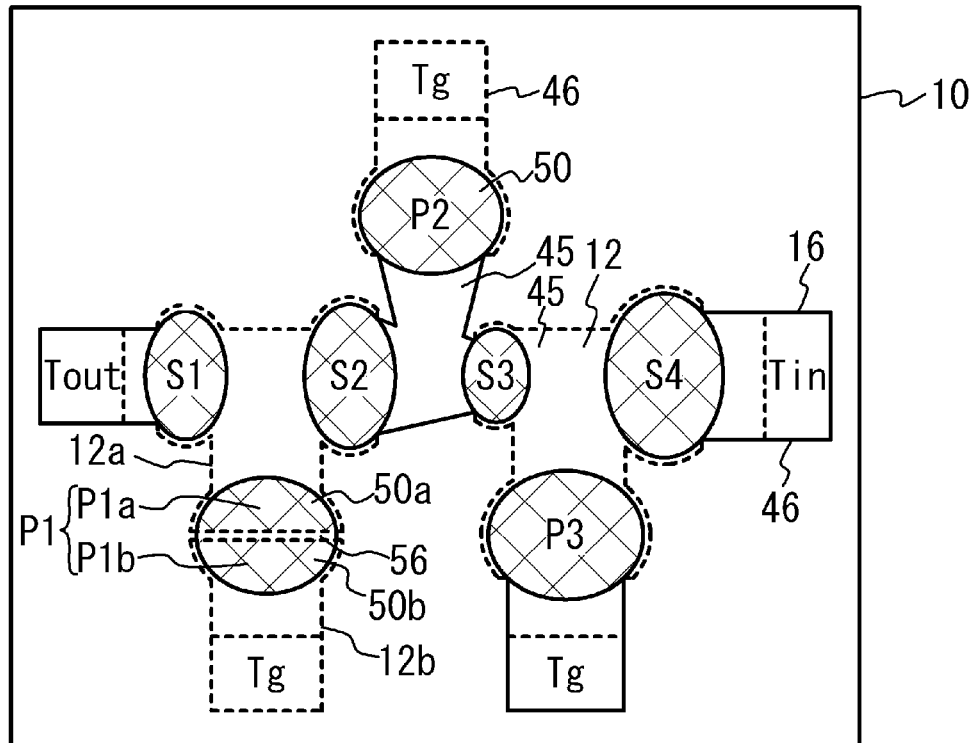
FIG. 14A is a plan view of a transmit filter in accordance with the second embodiment.
Figure 14B:
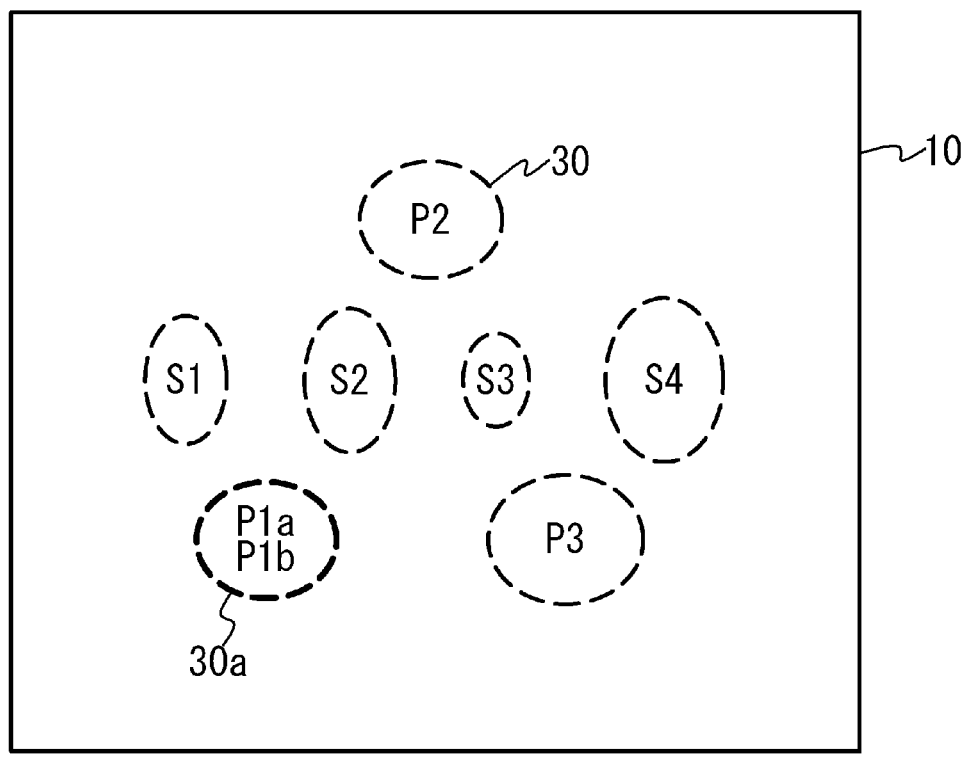
FIG. 14B is a plan view of an air gap.

FIG. 14A is a plan view of the transmit filter in the second embodiment, and FIG. 14B is a plan view of the air gap. As illustrated in FIG. 14A, the series resonators S1 to S4, the parallel resonators P1 to P3, wiring lines 45, and terminals 46 are formed on the substrate 10. Each of the series resonators S1 to S4 and the parallel resonators P1 to P3 has the resonance region 50 of its own. The wiring lines 45 connect the resonance regions 50 to each other, and connect the resonance regions 50 to the terminals 46. The terminals 46 include an input terminal Tin, an output terminal Tout and ground terminals Tg. The wiring lines 45 and the terminals 46 are formed of the lower electrodes 12 or the upper electrodes 16.

As illustrated in FIG. 14A and FIG. 14B, in the resonators other than the parallel resonator P1, a single resonance region 50 is provided for the single air gap 30. The resonators P1a and P1b correspond to the resonators 11a and 11b in accordance with the first embodiment and the variations of the first embodiment, and two resonance regions 50a and 50b and the dividing region 56 are provided for a single air gap 30a. The air gap 30a for the resonators P1a and P1b and other air gaps 30 have elliptical shapes. Since the air gaps 30a and 30 have the same shape, the stress condition for forming the piezoelectric film 14 and the like on the air gaps 30a and 30 can be adjusted to be substantially the same. Therefore, the air gaps 30a and 30, the piezoelectric film 14, and the like can be easily formed.

In the second embodiment, the transmit filter 40 includes piezoelectric thin film resonators corresponding to respective resonance regions 50 provided for the single air gap 30 in accordance with the first embodiment and the variations of the first embodiment. Therefore, the parasitic capacitance of the wiring line between the resonators P1a and P1b can be reduced. Thus, the secondary distortion can be reduced as in Patent Document 1. In addition, since the insulating film 18 is provided in the groove 55 between the lower electrodes 12a and 12b, the deterioration of the piezoelectric film or the like can be inhibited.

The second embodiment has described an example in which the first embodiment and the variations of the first embodiment are applied to the transmit filter 40, but the first embodiment and the variations of the first embodiment may be applied to the receive filter 42. An example in which the first embodiment and the variations of the first embodiment are applied to the ladder-type filter has been described, but the first embodiment and the variations of the first embodiment may be applied to a lattice-type filter or a multimode filter. The duplexer has been described as an example of the multiplexer, but the multiplexer may be a triplexer or a quadplexer.

The parallel resonator P1 is divided into the resonators P1a and P1b (divided resonators), and the respective resonance regions 50 corresponding to the resonators P1a and P1b share the air gap 30a. This structure reduces the secondary distortion. The resonator to be divided is at least one of the one or more series resonators and the one or more parallel resonators. To reduce the secondary distortion, the series resonator S1 electrically closest to the output terminal and or the parallel resonator P1 electrically closest to the output terminal is preferably divided. The number of series resonators and the number of parallel resonators can be freely selected.

Third Embodiment

Figure 15:
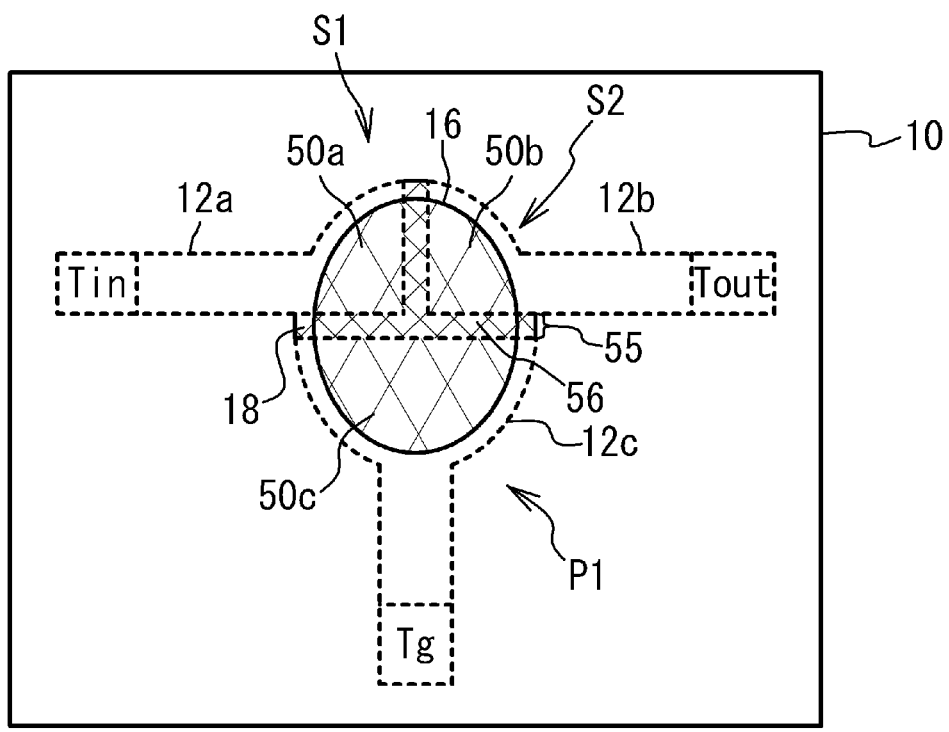
FIG. 15 is a plan view of a filter in accordance with a third embodiment.

A third embodiment is an example in which the first embodiment and the variations of the first embodiment are applied to a ladder-type filter. FIG. 15 is a plan view of a filter in accordance with the third embodiment. The resonance regions 50a to 50c and the insulating film 18 are illustrated by hatching. As illustrated in FIG. 15, three resonance regions 50a to 50c corresponding to the series resonators S1 and S2 and the parallel resonator P1, respectively share the air gap 30. The regions between each two of the resonance regions 50a and 50c are the dividing regions 56. The grooves 55 are located between each two of the lower electrodes 12a to 12c. The insulating film 18 is provided in the grooves 55. The upper electrode 16 is shared by the resonance regions 50a to 50c. The three resonators are electrically connected by the upper electrode 16. The lower electrodes 12a, 12b, and 12c are coupled to the input terminal Tin, the output terminal Tout, and the ground terminal Tg, respectively. Therefore, the series resonators S1 and S2 are connected in series between the input terminal Tin and the output terminal Tout, and the parallel resonator P1 is connected in parallel between the input terminal Tin and the output terminal Tout.

In the third embodiment, the resonance regions 50 corresponding to at least one of one or more series resonators and at least one of one or more parallel resonators share the air gap 30. This structure reduces the parasitic capacitance of the wiring line between the series resonator and the parallel resonator.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   one or more acoustic layers provided on the substrate, the one or more acoustic layers each being an air gap or an acoustic mirror that has a structure in which at least two layers having different acoustic characteristics are stacked;
   lower electrodes provided on the substrate, the lower electrodes sharing one acoustic layer of the one or more acoustic layers between the substrate and the lower electrodes, the lower electrodes being arranged to be separated from each other across a groove;
   an insulating film provided in the groove on the one acoustic layer;
   a piezoelectric film continuously provided on the lower electrodes and the groove; and
   an upper electrode continuously provided on the piezoelectric film to form resonators by sandwiching the piezoelectric film between the upper electrode and the lower electrodes,
   wherein a level difference between an upper surface of the insulating film and upper surfaces of the lower electrodes is equal to or less than ¾ of thicknesses of the lower electrodes.

2. The acoustic wave device according to claim 1, wherein the insulating film extends underneath the lower electrodes such that an extended part of the insulating film is provided on at least a part of each of lower surfaces of the lower electrodes.

3. The acoustic wave device according to claim 2, wherein the insulating film including said extended part overlaps with an entirety of the one acoustic layer in a plan view.

4. The acoustic wave device according to claim 1, wherein the acoustic layer is an air gap.

5. The acoustic wave device according to claim 4, wherein a the air gap is provided between a substantially flat surface of the substrate and the lower electrodes.

6. A filter comprising:
   the acoustic wave device according to claim 1.

7. A multiplexer comprising:
   the filter according to claim 6.

8. The acoustic wave device according to claim 1, wherein the upper electrode is not extracted to the outside of the acoustic layer in a plan view.

9. The acoustic wave device according to claim 1, wherein the insulating film is in contact with each of the lower electrodes.

10. The acoustic wave device according to claim 1, wherein the upper surface of the insulating film is located closer to the substrate than the upper surfaces of the lower electrodes, and is located closer to the piezoelectric film than lower surfaces of the lower electrodes.

11. The acoustic wave device according to claim 1, wherein side surfaces of the insulating film are in contact with side surfaces of the lower electrodes.

12. The acoustic wave device according to claim 1, further comprising an insertion film interposed between the upper electrode and at least one of the lower electrodes, the insertion film having a material different from a material of the piezoelectric film.

13. The acoustic wave device according to claim 1, wherein the level difference is equal to or less than ½ of the thicknesses of the lower electrodes.

14. An acoustic wave device comprising:
   a substrate;
   one or more acoustic layers provided on the substrate, the one or more acoustic layers each being an air gap or an acoustic mirror that has a structure in which at least two layers having different acoustic characteristics are stacked;
   lower electrodes provided on the substrate, the lower electrodes sharing one acoustic layer of the one or more acoustic layers between the substrate and the lower electrodes, the lower electrodes being arranged to be separated from each other across a groove;
   an insulating film provided in the groove on the one acoustic layer;
   a piezoelectric film continuously provided on the lower electrodes and the groove; and
   an upper electrode continuously provided on the piezoelectric film to form resonators by sandwiching the piezoelectric film between the upper electrode and the lower electrodes,
   wherein an upper surface of the insulating film and upper surfaces of the lower electrodes are substantially in the same plane.

15. An acoustic wave device comprising:
   a substrate;
   one or more acoustic layers provided on the substrate, the one or more acoustic layers each being an air gap or an acoustic mirror that has a structure in which at least two layers having different acoustic characteristics are stacked;
   lower electrodes provided on the substrate, the lower electrodes sharing one acoustic layer of the one or more acoustic layers between the substrate and the lower electrodes, the lower electrodes being arranged to be separated from each other across a groove;
   an insulating film provided in the groove on the one acoustic layer;
   a piezoelectric film continuously provided on the lower electrodes and the groove; and
   an upper electrode continuously provided on the piezoelectric film to form resonators by sandwiching the piezoelectric film between the upper electrode and the lower electrodes,
   wherein there is substantially no level difference between an upper surface of the insulating film and each of upper surfaces of the lower electrodes.

* * * * *